(12) United States Patent
Zhang et al.

(10) Patent No.: US 10,340,717 B2
(45) Date of Patent: Jul. 2, 2019

(54) CHARGING SYSTEM, CHARGING METHOD, AND POWER ADAPTER

(71) Applicant: Guangdong Oppo Mobile Telecommunications Corp, Ltd., Dongguan, Guangdong (CN)

(72) Inventors: Jialiang Zhang, Guangdong (CN); Shebiao Chen, Guangdong (CN); Jun Zhang, Guangdong (CN); Chen Tian, Guangdong (CN); Shiming Wan, Guangdong (CN); Jiada Li, Guangdong (CN)

(73) Assignee: Guangdong Oppo Mobile Telecommunications Corp., Ltd., Dongguan (CN)

( * ) Notice: Subject to any disclaimer, the term of this patent is extended or adjusted under 35 U.S.C. 154(b) by 33 days.

(21) Appl. No.: 15/725,055

(22) Filed: Oct. 4, 2017

(65) Prior Publication Data
US 2018/0034309 A1 Feb. 1, 2018

Related U.S. Application Data

(63) Continuation of application No. PCT/CN2016/091759, filed on Jul. 26, 2016.

(30) Foreign Application Priority Data

Feb. 5, 2016 (WO) ............... PCT/CN2016/073679

(51) Int. Cl.
*H02J 7/00* (2006.01)
*H04M 19/00* (2006.01)
(Continued)

(52) U.S. Cl.
CPC .......... *H02J 7/0072* (2013.01); *H01F 27/425* (2013.01); *H01M 10/0525* (2013.01);
(Continued)

(58) Field of Classification Search
CPC .... H02M 3/33523; H02M 1/08; H02J 7/0072; H02J 7/022; H02J 7/04
(Continued)

(56) References Cited

U.S. PATENT DOCUMENTS

| 4,087,733 A | 5/1978 | Casagrande |
| 6,137,265 A | 10/2000 | Cummings et al. |

(Continued)

FOREIGN PATENT DOCUMENTS

| CN | 202026118 U | 11/2011 |
| CN | 102545360 A | 7/2012 |

(Continued)

OTHER PUBLICATIONS

Extended European search report issued in corresponding European application No. 16889011.9 dated Apr. 6, 2018.
(Continued)

*Primary Examiner* — Zixuan Zhou
(74) *Attorney, Agent, or Firm* — Young Basile Hanlon & MacFarlane, P.C.

(57) ABSTRACT

A charging system, a charging method, and a power adapter are provided. The power adapter includes a first rectification unit, a switch unit, a transformer, a second rectification unit, a first charging interface, a sampling unit, and a control unit. The control unit is configured to output a control signal to the switch unit, and adjust a duty ratio of the control signal based on a voltage sampling value and/or current sampling value sampled by the sampling unit, in which a voltage of a third pulsating waveform output from the second rectification unit meets the charging requirements.

25 Claims, 18 Drawing Sheets

(51) Int. Cl.
  *H02J 7/02* (2016.01)
  *H02M 3/335* (2006.01)
  *H02J 7/04* (2006.01)
  *H02M 1/08* (2006.01)
  *H02J 7/06* (2006.01)
  *H02J 7/14* (2006.01)
  *H02J 7/24* (2006.01)
  *H02M 1/00* (2006.01)
  *H02M 3/156* (2006.01)
  *H02M 7/06* (2006.01)
  *H01F 27/42* (2006.01)
  *H01M 10/0525* (2010.01)
  *H02M 5/458* (2006.01)
  *H01F 27/40* (2006.01)

(52) U.S. Cl.
  CPC ............ *H02J 7/0004* (2013.01); *H02J 7/007* (2013.01); *H02J 7/008* (2013.01); *H02J 7/0009* (2013.01); *H02J 7/0027* (2013.01); *H02J 7/0029* (2013.01); *H02J 7/0042* (2013.01); *H02J 7/0044* (2013.01); *H02J 7/0045* (2013.01); *H02J 7/0052* (2013.01); *H02J 7/0091* (2013.01); *H02J 7/0093* (2013.01); *H02J 7/02* (2013.01); *H02J 7/022* (2013.01); *H02J 7/04* (2013.01); *H02J 7/041* (2013.01); *H02J 7/042* (2013.01); *H02J 7/045* (2013.01); *H02J 7/047* (2013.01); *H02J 7/06* (2013.01); *H02J 7/1492* (2013.01); *H02J 7/245* (2013.01); *H02M 1/00* (2013.01); *H02M 1/08* (2013.01); *H02M 3/156* (2013.01); *H02M 3/33507* (2013.01); *H02M 3/33515* (2013.01); *H02M 3/33523* (2013.01); *H02M 3/33546* (2013.01); *H02M 3/33569* (2013.01); *H02M 7/06* (2013.01); *H04M 19/00* (2013.01); *H01F 2027/408* (2013.01); *H02J 2007/0049* (2013.01); *H02J 2007/0059* (2013.01); *H02J 2007/0095* (2013.01); *H02J 2007/0096* (2013.01); *H02J 2007/0098* (2013.01); *H02M 5/458* (2013.01); *H02M 2001/0009* (2013.01); *H02M 2001/0048* (2013.01); *Y02D 70/20* (2018.01); *Y02D 70/26* (2018.01)

(58) Field of Classification Search
  USPC ............ 320/134, 136, 128, 145, 159, 164
  See application file for complete search history.

(56) References Cited

U.S. PATENT DOCUMENTS

| | | | |
|---|---|---|---|
| 6,909,617 | B1 | 6/2005 | Mirskiy |
| 2004/0090209 | A1 | 5/2004 | Nishida et al. |
| 2006/0284595 | A1 | 12/2006 | Hsieh et al. |
| 2008/0197811 | A1 | 8/2008 | Hartular et al. |
| 2012/0262950 | A1* | 10/2012 | Nate ............ H02J 9/005 363/16 |
| 2013/0141034 | A1 | 6/2013 | Huang et al. |
| 2013/0300375 | A1 | 11/2013 | Von Novak et al. |
| 2014/0159641 | A1 | 6/2014 | Geren |
| 2015/0180356 | A1* | 6/2015 | Norisada ............ H02M 3/33546 363/17 |
| 2016/0344200 | A1 | 11/2016 | Zhang et al. |

FOREIGN PATENT DOCUMENTS

| | | |
|---|---|---|
| CN | 202616850 U | 12/2012 |
| CN | 103746437 A | 4/2014 |
| CN | 103762702 A | 4/2014 |
| CN | 103795040 A | 5/2014 |
| CN | 203747451 U | 7/2014 |
| CN | 104810877 A | 7/2015 |
| CN | 104810879 A | 7/2015 |
| CN | 104967201 A | 10/2015 |
| CN | 104993182 A | 10/2015 |
| CN | 204858705 U | 12/2015 |
| CN | 204993090 U | 1/2016 |
| CN | 106026327 A | 10/2016 |
| EP | 2887492 A2 | 6/2015 |
| EP | 2930589 A1 | 10/2015 |
| EP | 2980958 A1 | 2/2016 |
| JP | 1-117666 A | 5/1989 |
| JP | 2-74127 A | 3/1990 |
| JP | 3-189569 A | 8/1991 |
| JP | 11-289766 A | 10/1999 |
| JP | 2002-281119 A | 9/2002 |
| JP | 2006-101657 A | 4/2006 |
| JP | 2010-040499 A | 2/2010 |
| JP | 2011-114955 A | 6/2011 |
| JP | 2013198262 A | 9/2013 |
| JP | 5454781 B2 | 3/2014 |
| JP | 2014-117129 A | 6/2014 |
| TW | 200616305 A | 5/2006 |
| TW | 200814506 A | 3/2008 |
| TW | M451735 U1 | 4/2013 |
| TW | 201535930 A | 9/2015 |
| WO | 2012167677 A1 | 12/2012 |
| WO | 2015/113341 A1 | 8/2015 |
| WO | 2015/113349 A1 | 8/2015 |

OTHER PUBLICATIONS

Office Action 1 issued in corresponding European application No. 16889011.9 dated Sep. 21, 2018.

Liang-Rui Chen, 'A Design of an Optimal Battery Pulse Charge System by Frequency-Varied Technique', IEEE Transactions on Industrial Electronics, vol. 54, No. 1, Feb. 2007, pp. 398-405.

\* cited by examiner

CHARGING SYSTEM, CHARGING METHOD, AND POWER ADAPTER

CROSS-REFERENCE TO RELATED APPLICATION(S)

This application is a continuation of international application PCT/CN2016/091759, filed on Jul. 26, 2016, which claims priority to international application PCT/CN2016/073679, filed on Feb. 5, 2016, the contents of both of which are hereby incorporated by reference in their entireties.

TECHNICAL FIELD

The present disclosure relates to the field of terminal equipment, and more particularly to a charging system, a charging method, and a power adapter.

BACKGROUND

Mobile terminals such as smart phones are becoming increasingly popular with consumers; however, mobile terminals generally consume a lot of power and so need to be frequently charged.

Usually a mobile terminal is charged through a power adapter which generally includes a primary rectifier circuit, a primary filter circuit, a transformer, a secondary rectifier circuit, a secondary filter circuit, a control circuit, etc., through which the power adapter can convert the input 220V alternating current (AC) into a stable low voltage direct current (DC) such as 5V suitable for the mobile terminal which is then provided to a power supply management device and battery of the mobile terminal for charging.

However, as the power of the power adapter experiences continuing increments, e.g., as it is upgraded from 5 W to 10 W, 15 W, 25 W or even higher, more electronic components that are able to withstand high power and can achieve better precision control would be required. This however will not only increase the size of the power adapter, but increase its production cost as well as manufacturing difficulties.

SUMMARY

This application is made on the basis of the inventor's knowledge and research on the following issues.

The inventor has found that, as the power of a power adapter increases, charging a mobile terminal battery using the power adapter may easily cause the battery's polarization resistance to increase and the battery temperature to rise, which would reduce the battery life and affect the battery's reliability and security.

Further, when powered from an AC power supply, most devices cannot work with AC power directly, because the AC power such as the 50 Hz/220V mains supply outputs power in an intermittent manner. In order to overcome such "intermittency", electrolytic capacitors would be required for energy storage. As such, when the waveform of the power supply is in a trough, continuity of the power supply could rely on the energy storage of the electrolytic capacitors to maintain a stable electricity supply. Therefore, when an AC power supply charges the mobile terminal through a power adapter, it can convert an AC power such as one of 220V supplied by the AC power supply to a stable DC by which the mobile terminal can be powered. However, the power adapter would indirectly power the mobile terminal when charging the battery of the mobile terminal. Since the battery can be a guarantee for the continuity of the power supply, it would be not necessary for the power adapter to continuously output a stable DC power when charging the battery.

Accordingly, there is provided a charging system, which applies a voltage of a pulsating waveform output from a power adapter directly to a battery of a terminal or applies a second DC output from the power adapter to the battery directly, thus can compatible with quick charging and normal charging as well as enable miniaturization and cost reduction of the power adapter and prolong the service life of the battery.

The charging system may include a first rectification unit, a switch unit, a transformer, a second rectification unit, a filter unit, a controllable switch, a first charging interface, a sampling unit, a control unit, a second charging interface and a battery coupled with the second charging interface. The first rectification unit is configured to rectify an input AC and output a voltage of a first pulsating waveform. The switch unit is configured to modulate the voltage of the first pulsating waveform according to a control signal. The transformer is configured to output a voltage of a second pulsating waveform according to the voltage of the modulated first pulsating waveform. The second rectification unit is configured to rectify the voltage of the second pulsating waveform and output a voltage of a third pulsating waveform. The filter unit is configured to filter the voltage of the third pulsating waveform and output a second DC. The controllable switch is configured to control whether the filter unit operates. The sampling unit is configured to sample the voltage and/or current output from the second rectification unit to obtain a voltage sampling value and/or a current sampling value. The control unit is coupled with the sampling unit, the switch unit, and the controllable switch respectively. The control unit is configured to control the controllable switch to cause the filter unit to operate to output the second DC via the first charging interface. The control unit is further configured to control the controllable switch to cause the filter unit to stop operating to output the voltage of the third pulsating waveform via the first charging interface. The control unit is further configured to output the control signal to the switch unit and adjust a duty ratio of the control signal according to the voltage sampling value and/or current sampling value such that the voltage of the third pulsating waveform or the second DC meets charging requirements. When the second charging interface is coupled with the first charging interface, it can apply the voltage of the third pulsating waveform or the second DC to the battery.

By means of the charging system, the system can be controlled to output the voltage of the third pulsating waveform or the second DC, which can be applied to the battery directly for charging, as such, the battery can be charged quickly and directly with a pulsating output voltage/current or charged normally with the second DC, thus can compatible with quick charging and normal charging. Magnitude of the pulsating output voltage/current is periodically changed, compared to the constant voltage/constant current, it is possible to reduce lithium precipitation of the lithium battery and prolong service life expectancy of the battery. Moreover, in terms of the pulsating output voltage/current, the probability and intensity of arcing of a contact of a charging interface may be reduced and the service life of the charging interface may be prolonged. Besides, it is beneficial to reduce polarization effect of the battery, improve charging speed, and reduce heat emitted by the battery, thus ensuring the reliability and safety of the terminal during charging. Moreover, since the voltage output from the power adapter is a voltage of a pulsating waveform, it is not necessary to provide an electrolytic capacitor in the power adapter, which will not only realize simplification and miniaturization of the power adapter, but greatly reduces the cost.

There is provided a power adapter according to a second aspect of the disclosure. The power adapter may include a first rectification unit, a switch unit, a transformer, a second rectification unit, a filter unit, a controllable switch, a first charging interface, a sampling unit, and a control unit. The first rectification unit is configured to rectify an input AC and output a voltage of a first pulsating waveform. The switch unit is configured to modulate the voltage of the first pulsating waveform according to a control signal. The transformer is configured to output a voltage of a second pulsating waveform according to the voltage of the modulated first pulsating waveform. The second rectification unit is configured to rectify the voltage of the second pulsating waveform and output a voltage of a third pulsating waveform. The filter unit is configured to filter the voltage of the third pulsating waveform and output a second DC. The controllable switch is configured to control whether the filter unit operates. The first charging interface is configured to apply the voltage of the third pulsating waveform or the second DC to a battery of a terminal via a second charging interface when the first charging interface is coupled to the second charging interface of the terminal, in which the second charging interface is coupled with the battery. The sampling unit is configured to sample the voltage and/or current output from the second rectification unit to obtain a voltage sampling value and/or current sampling value. The control unit is coupled with the sampling unit, the switch unit, and the controllable switch respectively. The control unit is configured to control the controllable switch to cause the filter unit to operate to output the second DC via the first charging interface. The control unit is further configured to control the controllable switch to cause the filter unit to stop operating to output the voltage of the third pulsating waveform via the first charging interface. The control unit is further configured to output the control signal to the switch unit and adjust a duty ratio of the control signal according to the voltage sampling value and/or current sampling value such that the voltage of the third pulsating waveform or the second DC meets charging requirements.

By means of the power adapter, the voltage of the third pulsating waveform or the second DC can be output via the first charging interface and then applied directly to the battery of the terminal via the second charging interface of the terminal. As such, the battery can be charged quickly and directly with a pulsating output voltage/current or charged normally with the second DC, thus can compatible with quick charging and normal charging. Magnitude of the pulsating output voltage/current is periodically changed, compared to the constant voltage/constant current, it is possible to reduce lithium precipitation of the lithium battery and prolong service life expectancy of the battery. Moreover, in terms of the pulsating output voltage/current, the probability and intensity of arcing of a contact of a charging interface may be reduced and the service life of the charging interface may be prolonged. Besides, it is beneficial to reduce polarization effect of the battery, improve charging speed, and reduce heat emitted by the battery, thus ensuring the reliability and safety of the terminal during charging. Moreover, since the voltage output from the power adapter is a voltage of a pulsating waveform, it is not necessary to provide an electrolytic capacitor, which will not only realize simplification and miniaturization of the power adapter, but greatly reduces the cost.

In order to achieve the above objects, according to implementations of a third aspect of the disclosure, there is provided a charging method. The method may include the follows. When a first charging interface of a power adapter is coupled with a second charging interface of a terminal, a first rectification is performed on an input AC to output a voltage of a first pulsating waveform. The voltage of the first pulsating waveform is modulated by controlling a switch unit and converted by a transformer to output a voltage of a second pulsating waveform. A secondary rectification is conducted on the voltage of the second pulsating waveform to output a voltage of a third pulsating waveform. When the power adapter charges the terminal with a normal charging mode, the voltage of the third pulsating waveform is filtered to output a second DC which is then applied to a battery of the terminal via the second charging interface. When the power adapter charges the terminal with a quick charging mode, the voltage of the third pulsating waveform is applied to the battery of the terminal directly via the second charging interface. The voltage and/or current can be sampled after the secondary rectification to acquire a voltage sampling value and/or current sampling value. A duty ratio of a control signal of the switch unit can be adjusted according to the voltage sampling value and/or current sampling value, such that the voltage of the third pulsating waveform or the second DC meets charging requirements.

By means of the charging method, the power adapter can be controlled to output the voltage of the third pulsating waveform or the second DC that meets the charging requirements, which can be applied to the battery of the terminal directly, as such, the battery can be charged quickly and directly with a pulsating output voltage/current or charged normally with the second DC, thus can compatible with quick charging and normal charging. Magnitude of the pulsating output voltage/current is periodically changed, compared to the constant voltage/constant current, it is possible to reduce lithium precipitation of the lithium battery and prolong service life expectancy of the battery. Moreover, in terms of the pulsating output voltage/current, the probability and intensity of arcing of a contact of a charging interface may be reduced and the service life of the charging interface may be prolonged. Besides, it is beneficial to reduce polarization effect of the battery, improve charging speed, and reduce heat emitted by the battery, thus ensuring the reliability and safety of the terminal during charging. Moreover, since the voltage output from the power adapter is a voltage of a pulsating waveform, it is not necessary to provide an electrolytic capacitor in the power adapter, which will not only realize simplification and miniaturization of the power adapter, but greatly reduces the cost.

DETAILED DESCRIPTION

Figure 1A:
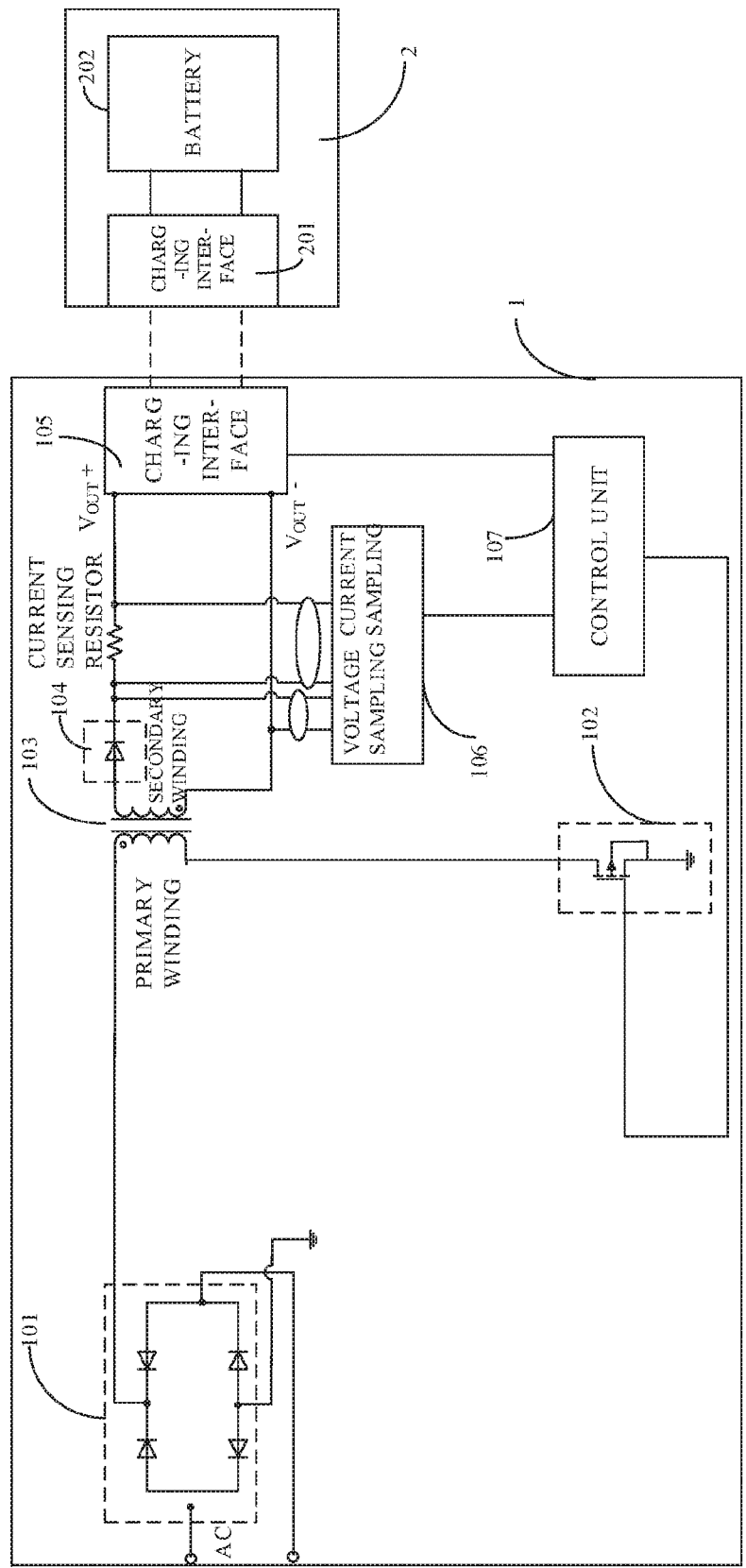
FIG. 1A is a block diagram illustrating a charging system according to an implementation of the disclosure in which a fly-back switching power supply is used.

Below implementations of the disclosure will be described in detail, examples of which are shown in the accompanying drawings, in which the same or similar reference numerals have been used throughout to denote the same or similar elements or elements serving the same or similar functions. The implementations described below with reference to the accompanying drawings are exemplary only, meaning they are intended to be illustrative of rather than limiting the disclosure.

A charging system, a charging method, and a power adapter according to implementations will be described below with reference to the accompanying drawings.

As illustrated through FIG. 1A to FIG. 14, the charging system according to implementations of the disclosure may include a power adapter 1 and a terminal 2.

As illustrated in the figures, the power adapter 1 may include a first rectification unit 101, a switch unit 102, a transformer 103, a second rectification unit 104, a first charging interface 105, a sampling unit 106, a control unit 107, a controllable switch 108, and a filter unit 109. The first rectification unit 101 may be configured to rectify an input AC (e.g., an AC mains supply of 220V) and output a voltage of a first pulsating waveform, e.g., a voltage of a waveform analogous to a steamed-bun. As illustrated in FIG. 1A, the first rectification unit 101 can be a full-bridge rectification circuit including four diodes. The switch unit 102 may be configured to modulate the voltage of the first pulsating waveform according to a control signal. The switch unit 102 may include a MOS transistor, on which a pulse width modulation (PWM) control can be applied to achieve a chopping modulation on the steamed-bun shaped wave. The transformer 103 may be configured to output a voltage of a second pulsating waveform based on the voltage of the modulated first pulsating waveform. The second rectification unit 104 may be configured to rectify the voltage of the second pulsating waveform and output a voltage of a third pulsating waveform. The second rectification unit 104 may include a diode or a MOS transistor so as to achieve synchronous rectification at the secondary side such that the third pulsating waveform would be synchronized with the modulated first pulsating waveform. By "the third pulsating waveform would be synchronized with the modulated first pulsating waveform", it may mean that the phase of the third pulsating waveform may be consistent with that of the modulated first pulsating waveform and that the variation trend of the amplitude of the third pulsating waveform may be consistent with that of the modulated first pulsating waveform. The filter unit 109 is configured to filter the voltage of the third pulsating waveform to output a second direct current (DC), which is a DC supporting a normal charging mode. The controllable switch 108 is configured to control whether the filter unit 109 operates. The sampling unit 106 may be configured to sample a voltage and/or a current output from the second rectification unit 104 to obtain a voltage sampling value and/or a current sampling value. The control unit 107 may be coupled with the sampling unit 106, the switch unit 102, and the controllable switch 108 respectively. The control unit 107 may control the controllable switch 108 to cause the filter unit 109 to operate, so as to output the second DC via the first charging interface 105, i.e., the power adapter can charge the terminal with the normal charging mode. The control unit 107 may control the controllable switch 108 to cause the filter unit 109 to stop operating, so as to output the voltage of the third pulsating waveform via the first charging interface, i.e., the power adapter can charge the terminal with a quick charging mode. The control unit 107 may output a control signal to the switch unit 102 and adjust a duty ratio of the control signal according to the voltage sampling value and/or the current sampling value, so that the voltage of the third pulsating waveform or the second DC would be able to meet charging requirements.

Figure 2:
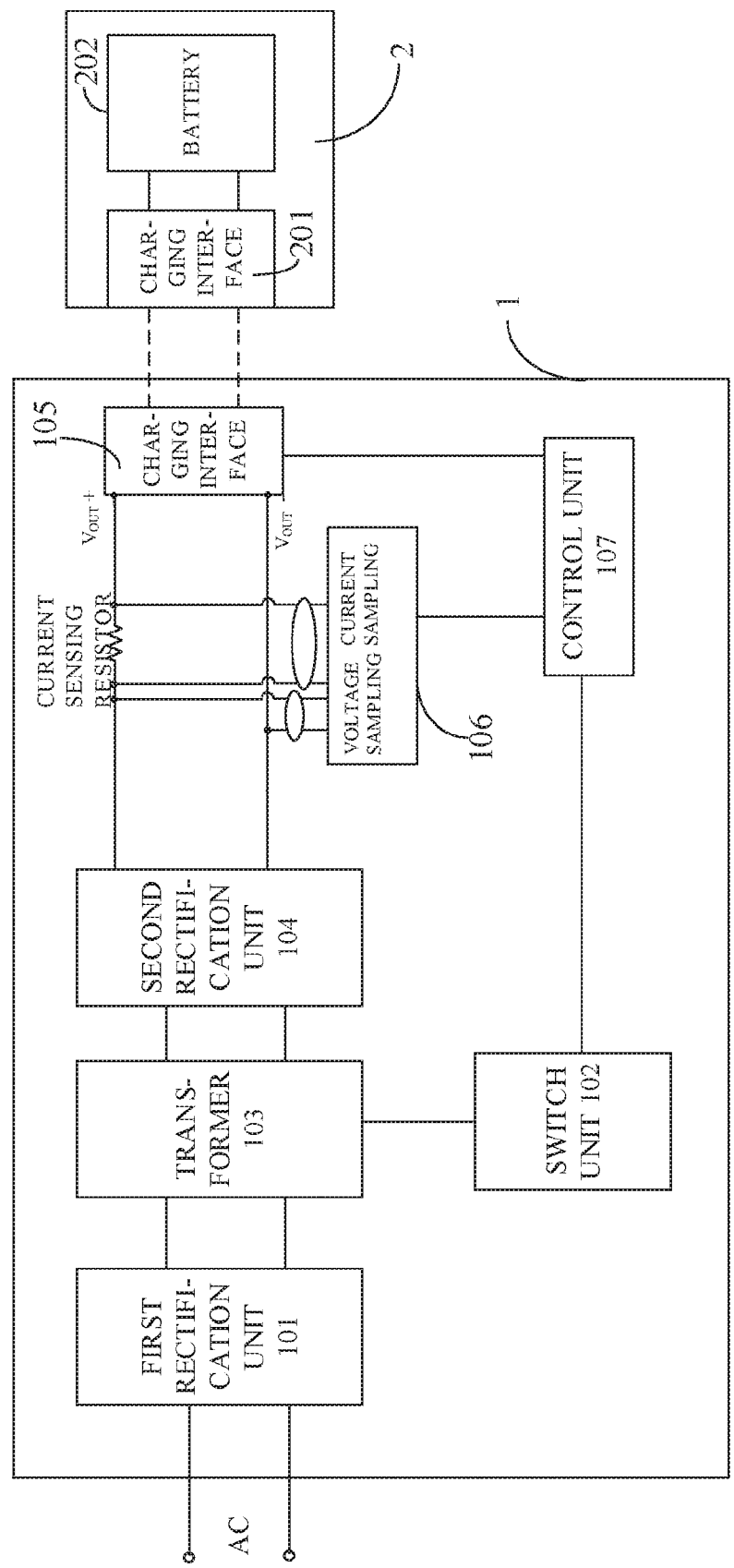
FIG. 2 is a block diagram illustrating a charging system according to an implementation of the disclosure.

As illustrated in FIG. 2, the terminal 2 may include a second charging interface 201 and a battery 202 coupled to the second charging interface 201. When the second charging interface 201 is coupled with the first charging interface 105, the second charging interface 201 can apply the voltage of the third pulsating waveform or the second DC to the battery 202 so as to charge the battery 202 quickly or normally.

In one implementation, as illustrated in FIG. 1A, the power adapter 1 can adopt a fly-back switching power supply. The transformer 103 may include a primary winding and a secondary winding. The first rectification unit 101 may have a first output end and a second output end. The primary winding may have one end coupled with the first output end of the first rectification unit 101, the second output end of the first rectification unit 101 being grounded. The primary winding may have the other end coupled with the switch unit 102, e.g., when the switch unit 102 is a MOS transistor, the other end of the primary winding may be coupled with the drain of the MOS transistor. The transformer 103 may be configured to output the voltage of the second pulsating waveform based on the voltage of the modulated first pulsating waveform.

The transformer 103 may be a high-frequency transformer with an operating frequency of 50 kHz to 2 MHz. The high-frequency transformer may couple the voltage of the modulated first pulsating waveform to the secondary side and output it by the secondary winding. In the implementation, the power adapter 1 can be downsized by adopting the high-frequency transformer with a small size advantage of over a low-frequency transformer. The low-frequency transformer is also known as an industrial frequency transformer, mainly used for the frequency of mains supply, such as AC of 50 Hz or 60 Hz.

Figure 1B:
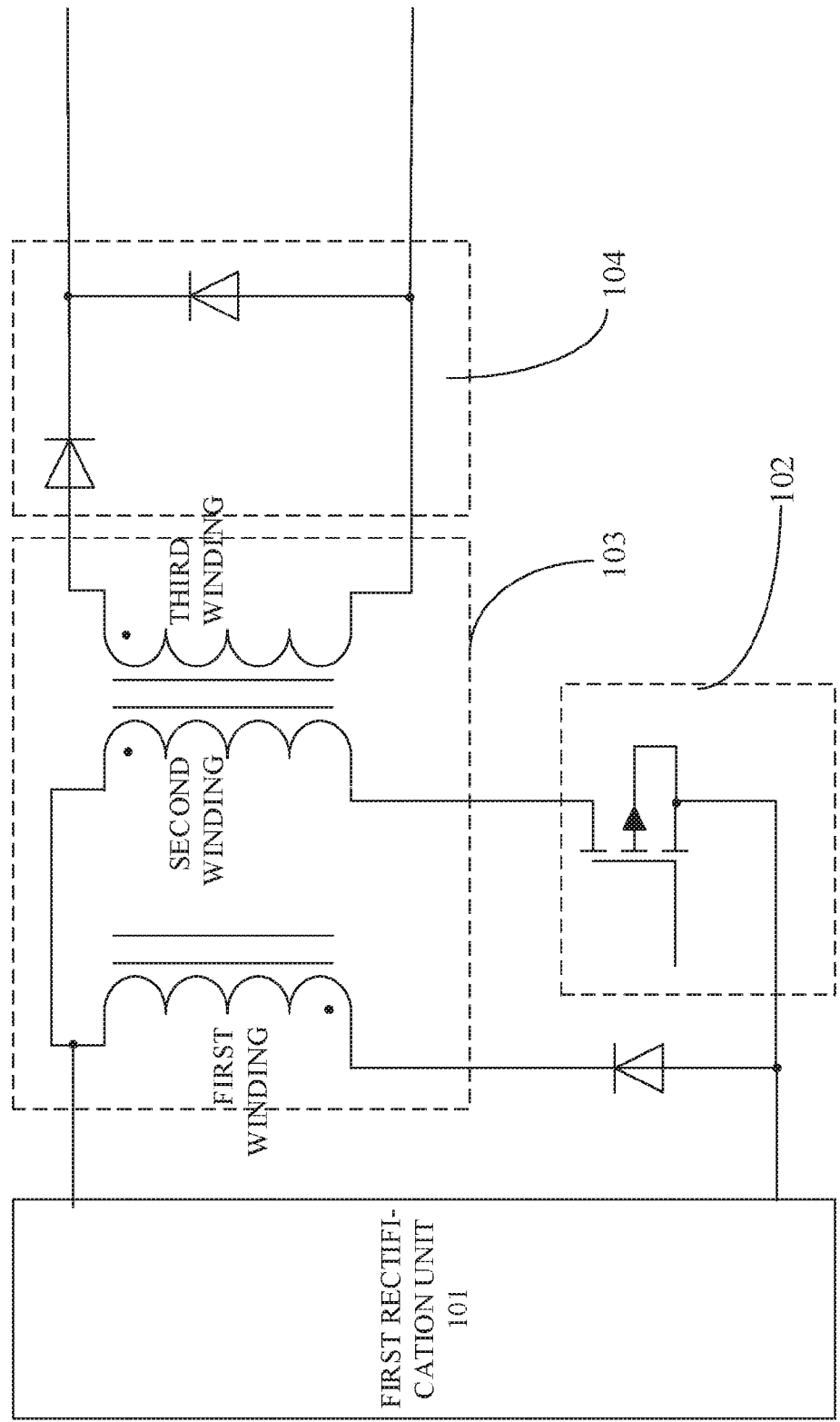
FIG. 1B is a block diagram illustrating a charging system according to an implementation of the disclosure in which a forward switching power supply is used.

According to one implementation, as illustrated in FIG. 1B, the power adapter 1 may also adopt a forward-switching power supply. The transformer 103 may include a first winding, a second winding, and a third winding. A dotted end (also referred to as "dotted terminal") of the first winding may be coupled to the second output end of the first rectification unit 101 via a backward diode. A synonym end (also referred to as "synonym terminal" or "un-dotted terminal") of the first winding may be coupled to the first output end of the first rectification unit 101 after being coupled with the dotted end of the second winding. The synonym end of the second winding may be coupled with the switch unit 102. The third winding may be coupled with the second rectification unit 104. The backward diode may serve an inverse peak clipping function. The inductive electromotive force generated by the first winding can be used to limit the amplitude of the back electromotive force through the backward diode. The clamping energy can be returned to the output of the first rectification unit for charging the same. The magnetic field generated by the current flowing through the first winding can demagnetize the core of the transformer so that the magnetic field strength in the transformer core would return to its initial state. The transformer 103 may be configured to output the voltage of the second pulsating waveform based on the voltage of the modulated first pulsating waveform.

Figure 1C:
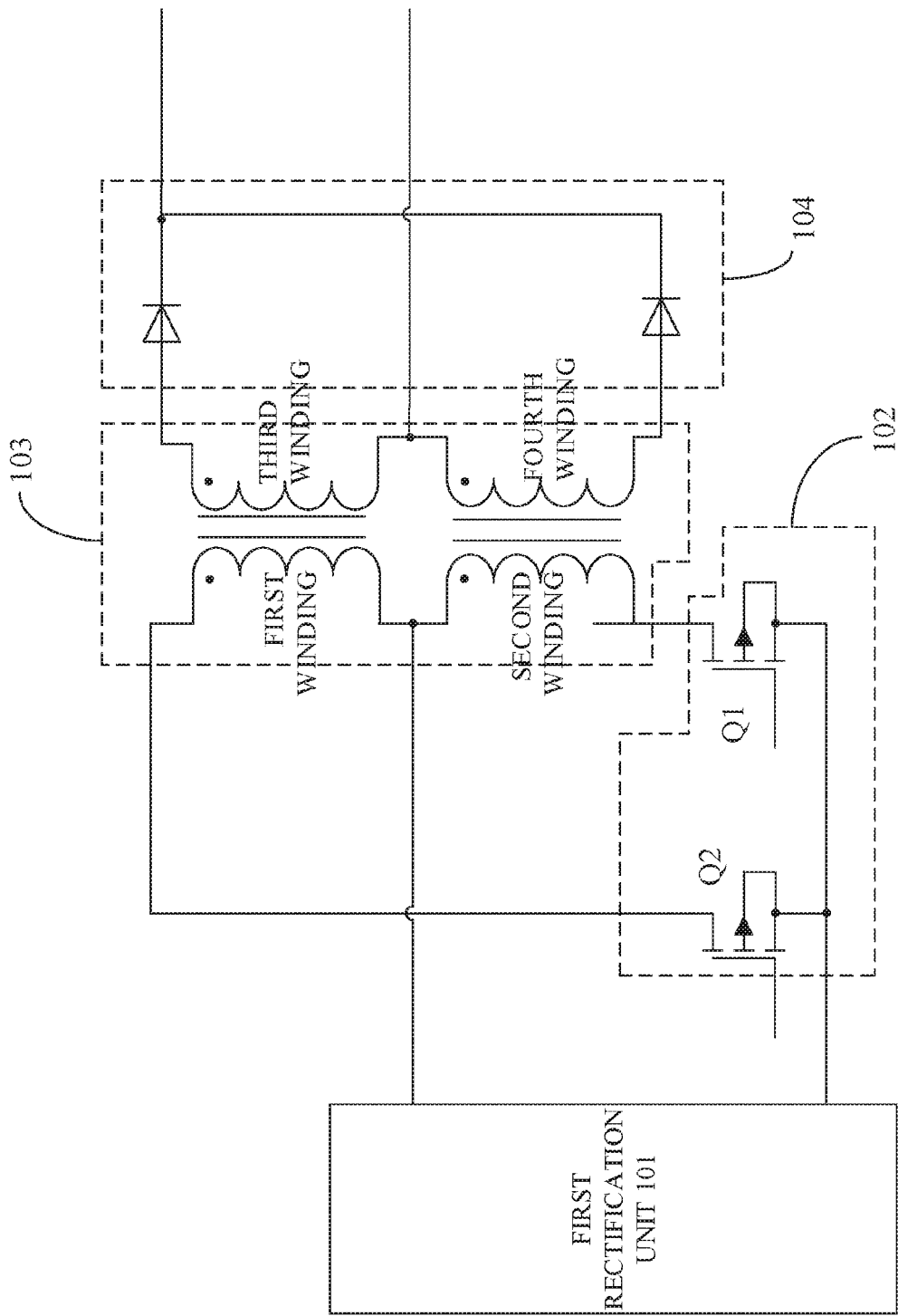
FIG. 1C is a block diagram illustrating a charging system according to an implementation of the disclosure in which a push-pull switching power supply is used.

According to an implementation as illustrated in FIG. 1C, the power adapter 1 can adopt a push-pull switching power supply. The transformer may include a first winding, a second winding, a third winding, and a fourth winding. The dotted end of the first winding may be coupled with the switch unit. The synonym end of the first winding may be coupled to the first output end of the first rectification unit after being coupled with the dotted end of the second winding. The synonym end of the second winding may be coupled to the switch unit. The synonym end of the third winding may be coupled to the dotted end of the fourth winding. The transformer may be configured to output the voltage of the second pulsating waveform based on the voltage of the modulated first pulsating waveform.

As illustrated in FIG. 1C, the switch unit 102 may include a first MOS transistor Q1 and a second MOS transistor Q2. The transformer 103 may include a first winding, a second winding, a third winding, and a fourth winding. The dotted end of the first winding may be coupled to the drain of the second MOS transistor Q2. The synonym end of the first winding may be coupled to the dotted end of the second winding, and the node between the synonym end of the first winding and the dotted end of the second winding may be coupled to the first output end of the first rectification unit 101. The synonym end of the second winding may be coupled to the drain of the first MOS transistor Q1. The source of the first MOS transistor Q1 may be coupled to the second output end of the first rectification unit 101 after being coupled with the source of the second MOS transistor Q2. The dotted end of the third winding may be coupled to the first input end of the second rectification unit 104. The synonym end of the third winding may be coupled to the dotted end of the fourth winding. The node between the synonym end of the third winding and the dotted end of the fourth winding may be grounded. The synonym end of the fourth winding may be coupled to the second input end of the second rectification unit 104.

As illustrated in FIG. 1C, the first input end of the second rectification unit 104 may be coupled to the dotted end of the third winding. The second input end of the second rectification unit 104 may be coupled to the synonym end of the fourth winding. The second rectification unit 104 may be configured to rectify the voltage of the second pulsating waveform to output the voltage of the third pulsating waveform. The second rectification unit 104 may include two diodes. The anode of one diode may be coupled to the dotted end of the third winding, the anode of the other diode may be coupled to the synonym end of the fourth winding, and the cathode of the two diodes may be coupled together.

Figure 1D:
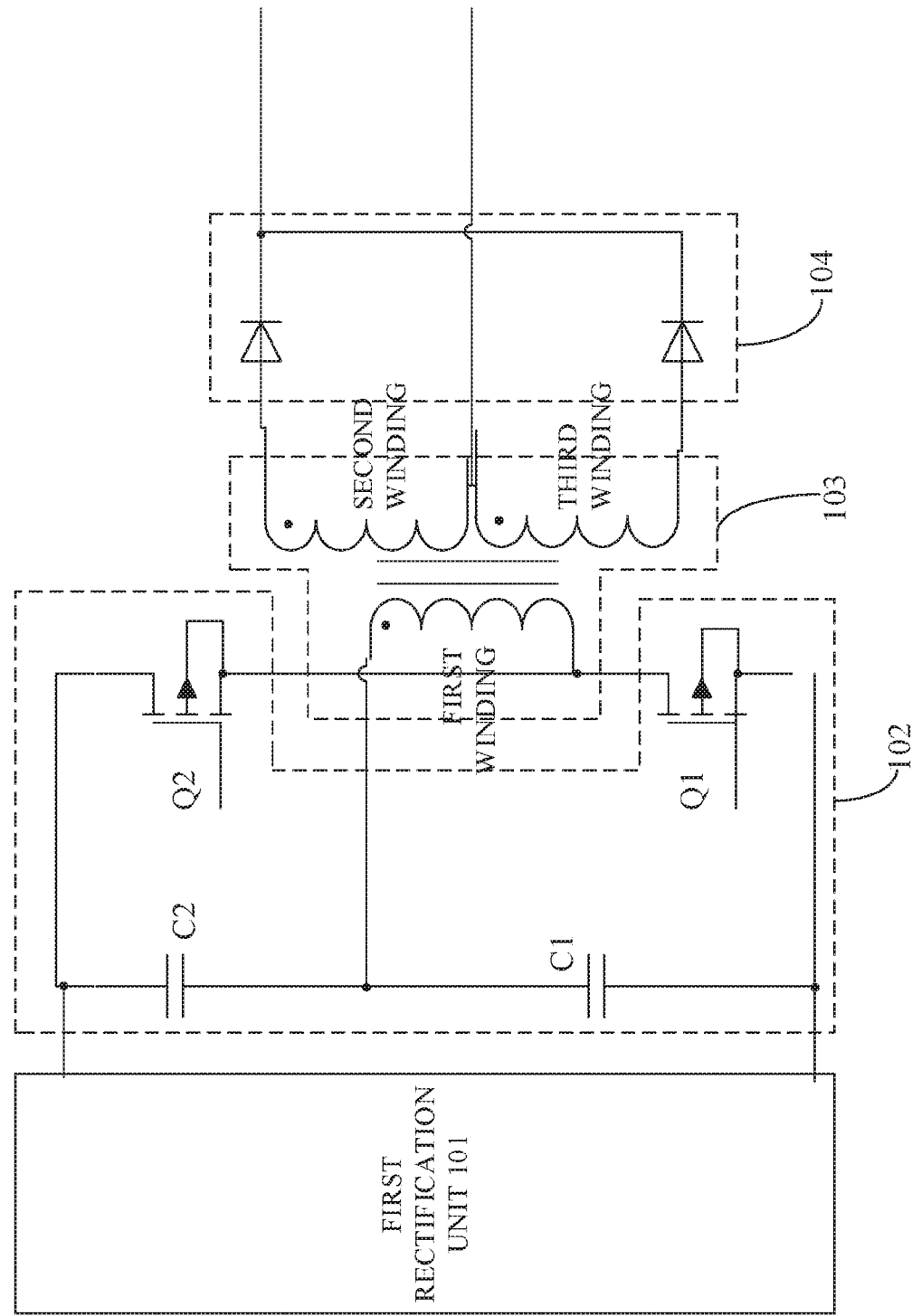
FIG. 1D is a block diagram illustrating a charging system according to an implementation of the disclosure in which a half-bridge switching power supply is used.

According to another implementation, as illustrated in FIG. 1D, the power adapter 1 may adopt a half-bridge switching power supply. The switch unit 102 may include a first MOS transistor Q1, a second MOS transistor Q2, a first capacitor C1, and a second capacitor C2. The first capacitor C1 and second capacitor C2 which are coupled in series may be coupled in parallel to the output end of the first rectification unit 101. The first MOS transistor Q1 and the second MOS transistor Q2 coupled in series may be coupled in parallel to the output end of the first rectification unit 101. The transformer 103 may include a first winding, a second winding, and a third winding. The dotted end of the first winding may be coupled to a node between the first capacitor C1 and the second capacitor C2 coupled in series. The synonym end of the first winding may be coupled to the node between the first MOS transistor Q1 and the second MOS transistor Q2 coupled in series. The dotted end of the second winding may be coupled to the first input end of the second rectification unit 104. The synonym end of the second winding may be grounded after being coupled to the dotted end of the third winding. The synonym end of the third winding may be coupled to the second input end of the second rectification unit 104. The transformer 103 may be configured to output the voltage of the second pulsating waveform based on the voltage of the modulated first pulsating waveform.

Figure 1E:
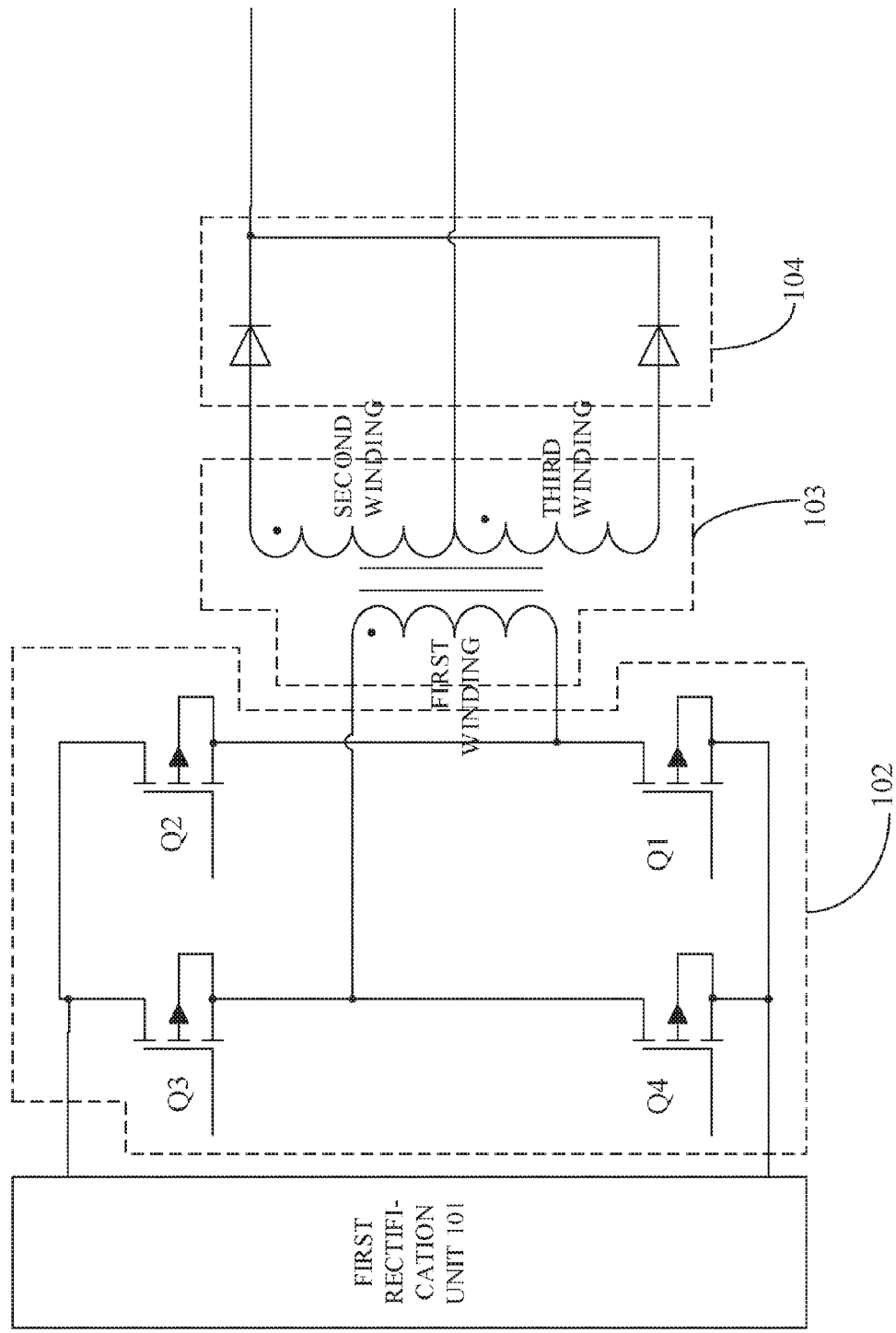
FIG. 1E is a block diagram illustrating a charging system according to an implementation of the disclosure in which a full-bridge switching power supply is used.

According to an implementation, as illustrated in FIG. 1E, the power adapter 1 may adopt a full-bridge switching power supply. The switch unit 102 may include a first MOS transistor Q1, a second MOS transistor Q2, a third MOS transistor Q3, and a fourth MOS transistor Q4. The third MOS transistor Q3 and the fourth MOS transistor Q4 that are connected in series may be coupled in parallel to the output end of the first rectification unit 101. The first MOS transistor Q1 and the second MOS transistor Q2 that are connected in series may be coupled in parallel to the output end of the first rectification unit 101. The transformer 103 may include a first winding, a second winding, and a third winding. The dotted end of the first winding may be coupled to a node between the third MOS transistor Q3 and the fourth MOS transistor Q4 coupled in series. The synonym end of the first winding may be coupled to a node between the first MOS transistor Q1 and the second MOS transistor Q2 coupled in series. The dotted end of the second winding may be coupled to the first input end of the second rectification unit 104. The synonym end of the second winding may be grounded after being coupled to the dotted end of the third winding. The synonym end of the third winding may be coupled to a second input end of the second rectification unit 104. The transformer 103 may be configured to output the voltage of the second pulsating waveform based on the voltage of the modulated first pulsating waveform.

Therefore, according to implementations herein power adapter 1 may employ any one of a fly-back switching power supply, a forward switching power supply, a push-pull switching power supply, a half-bridge switching power supply, and a full-bridge switching power supply to output the voltage of the pulsating waveform.

Further, as illustrated in FIG. 1A, the second rectification unit 104 may be coupled to the secondary winding of the transformer 103. The second rectification unit 104 may be configured to rectify the voltage of the second pulsating waveform and output the voltage of the third pulsating waveform. The second rectification unit 104 may include a diode in order to achieve synchronous rectification at the secondary side, such that the third pulsating waveform could be synchronized with the modulated first pulsating waveform. By "the third pulsating waveform could be synchronized with the modulated first pulsating waveform", it may mean that the phase of the third pulsating waveform is consistent with that of the modulated first pulsating waveform and the variation trend of the amplitude of the third pulsating waveform is consistent with that of the modulated first pulsating waveform. The first charging interface 105 may be coupled with the second rectification unit 104. The sampling unit 106 may be configured to sample a voltage and/or a current output from the second rectification unit 104 to obtain a voltage sampling value and/or a current sampling value. The control unit 107 may be coupled with the sampling unit 106 and the switch unit 102 respectively. The control unit 107 may output a control signal to the switch unit 102 and thus adjust the duty ratio of the control signal based on the voltage sampling value and/or the current sampling value, such that the voltage of the third pulsating waveform output from the second rectification unit 104 would be able to meet the charging requirements.

As illustrated in FIG. 1A, the terminal 2 may include a second charging interface 201 and a battery 202 coupled to the second charging interface 201. When the second charging interface 201 is coupled with the first charging interface 105, the second charging interface 201 can apply the voltage of the third pulsating waveform to the battery 202, so as to charge the battery 202.

Figure 3:
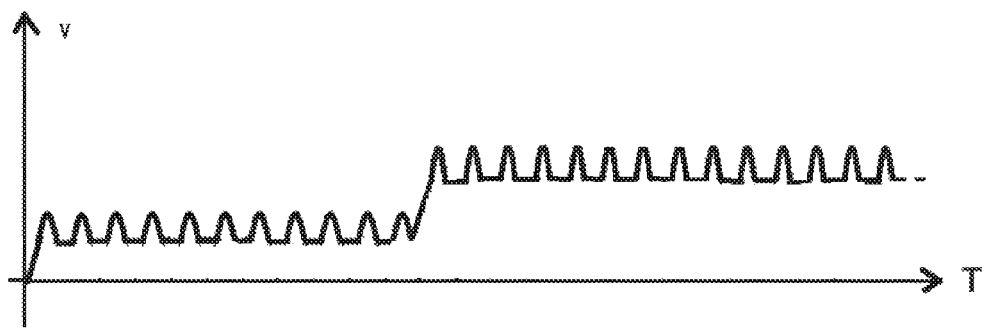
FIG. 3 is a schematic diagram illustrating a waveform of a charging voltage output from a power adapter to a battery according to an implementation of the disclosure.
Figure 4:
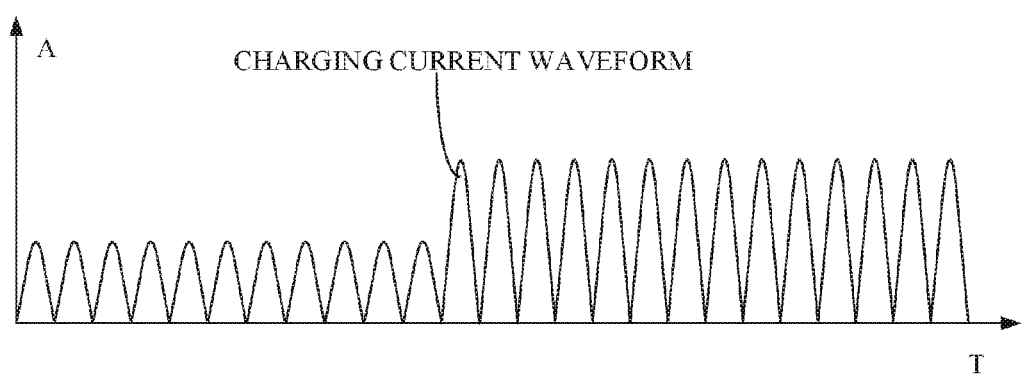
FIG. 4 is a schematic diagram illustrating a waveform of a charging current output from a power adapter to a battery according to an implementation of the disclosure.

By "the voltage of the third pulsating waveform would be able to meet the charging requirements", it may mean that the voltage of the third pulsating waveform reaches the desired charging voltage when charging the battery, and/or the current of the third pulsating waveform reaches the desired charging current when charging the battery. In other words, the control unit 107 may adjust the duty ratio of the control signal such as a PWM signal based on the sampled voltage and/or current output from the power adapter. The output of the second rectification unit 104 may be adjusted in real time to achieve closed-loop regulation and control, such that the voltage of the third pulsating waveform could meet the charging requirements of the terminal 2, and the battery 202 can be guaranteed to be safely and reliably charged. FIG. 3 is a schematic diagram in which waveform of a charging voltage output to the battery 202 is adjusted through the duty ratio of the PWM signal. FIG. 4 is a schematic diagram in which the waveform of a charging current output to the battery 202 is adjusted through the duty ratio of the PWM signal.

It should be noted that, when adjusting the duty ratio of the PWM signal, an adjusting instruction can be generated based on the voltage sampling value or the current sampling value, or based on both the voltage sampling value and the current sampling value.

Thus, in an implementation, by controlling the switch unit 102, a PWM chopping modulation can be performed directly on the rectified voltage of the first pulsating waveform, i.e., the voltage of the steamed-bun shaped waveform. Thereafter, the modulated voltage is transferred to the high-frequency transformer and coupled to the secondary side from the primary side through the high-frequency transformer, and then restored to the steamed-bun shaped wave voltage/current after synchronous rectification and directly delivered to the battery. As such, quick charging of the battery can be achieved. The magnitude of the steamed-bun shaped wave voltage can be adjusted via adjusting the duty ratio of a PWM signal, whereby the output of the power adapter can meet the battery charging requirements. As can be seen, the power adapter provided by the implementation eliminates the primary electrolytic capacitor and the secondary electrolytic capacitor and uses a steamed-bun shaped wave voltage to directly charge the battery, which can reduce the size of the power adapter to achieve miniaturization of the power adapter, and can greatly reduce the cost.

As one implementation, the control unit 107 can be a micro controller unit (MCU), i.e., a microprocessor integrated with a switch driving control function, a synchronous rectification function, a voltage current regulation and control function.

According to one implementation, the control unit 107 is also configured to adjust the frequency of the control signal based on the voltage sampling value and/or the current sampling value. That is, the PWM signal is controlled to be continuously output to the switch unit 102 for a period of time before the output is stopped, then the output of the PWM signal is enabled again after the predetermined time has elapsed. In this way, the voltages applied to the battery would be intermittent and so the battery would be intermittently charged, avoiding security risks caused by heat produced during continuous charging of the battery and thus improving the battery charging reliability and security.

For lithium batteries in low temperature conditions, the charging process is likely to intensify the polarization degree because the ionic conductivity and electronic conductivity of the lithium battery decrease, and continuous charging may make this polarization phenomenon become increasingly obvious; at the same time, the possibility of lithium precipitation also increases, affecting the safety performance of the battery. Continuous charging may cause a constant accumulation of heat generated during the continuous charging, causing the internal battery temperature to rise, and when the temperature exceeds a certain limit, the battery performance will be limited and security risks will increase.

In the implementation, the frequency of the control signal is adjusted so that the power adapter makes output intermittently, which is equivalent to introducing a battery standing process during the battery charging process. In this way, the lithium precipitation caused by polarization during continuous charging can be alleviated and the impact of the continuing accumulation of heat can be mitigated, whereby cooling effects can be achieved and the battery charging reliability and safety can be ensured.

Figure 5:
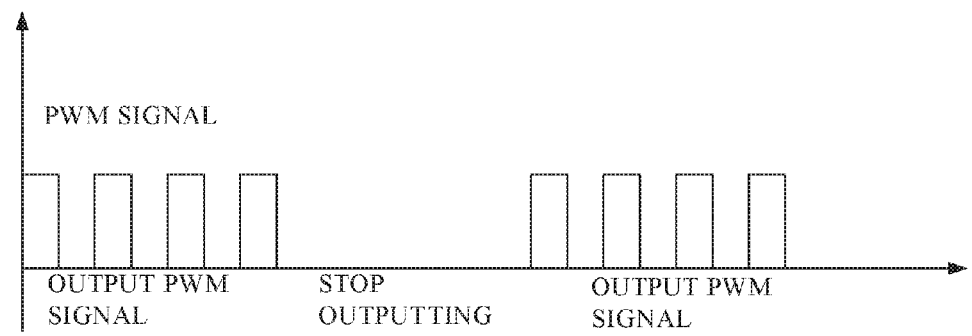
FIG. 5 is a schematic diagram illustrating a control signal output to a switch unit according to an implementation of the disclosure.

The control signal output to the switch unit 102 is illustrated in FIG. 5, in which output of the PWM signal can continue for a period of time before it stops for another period of time, and then again continues for yet another period of time. The control signals output to the switch unit 102 are intermittent and the frequency is adjustable.

As illustrated in FIG. 1A, the control unit 107 is coupled with the first charging interface 105, and is also configured to communicate with the terminal 2 via the first charging interface 105 to acquire the status information of the terminal 2. As such, the control unit 107 is also configured to adjust the duty ratio of the control signal such as the PWM signal based on the terminal status information and the voltage sampling value and/or the current sampling value.

The terminal status information may include the power of the battery, temperature of the battery, voltage of the battery, interface information of the terminal, and path impedance information of the terminal.

The first charging interface 105 includes a power wire and a data wire. The power wire is configured to charge the battery, and the data wire is configured to communicate with the terminal. When the second charging interface 201 is coupled to the first charging interface 105, the power adapter 1 and the terminal 2 can send an inquiry communication instruction to each other. When a corresponding reply instruction is received, a communication connection can be established between the power adapter 1 and the terminal 2. The control unit 107 can acquire the status information of the terminal 2 to negotiate the charging mode and charging parameters (such as the charging current and the charging voltage) with the terminal 2 and so control the charging process.

The charging mode supported by the power adapter and/or the terminal may include a normal charging mode and a quick charging mode. The charging speed of the terminal in the quick charging mode is greater than that of the normal charging mode, e.g., the charging current of the quick charging mode may be greater than that of the normal charging mode. Generally, the normal charging mode can be understood as one with a rated output voltage of 5V and a rated output current less than or equal to 2.5A. In the normal charging mode, D+ line and D− line in the output port data wire of the power adapter can be shorted. Different from the normal charging mode, under the quick charging mode the power adapter can use the D+ line and D− line in the data wire to communicate with the terminal for data exchange, which means the power adapter and the terminal can transmit a quick charging instruction to each other. For example, the power adapter can transmit a quick charging inquiry instruction to the terminal, and after receiving a quick charging reply instruction from the terminal, the power adapter can acquire the status information of the terminal and enable the quick charging mode according to the reply instruction from the terminal. In the quick charging mode, the charging current can be greater than 2.5A, for example, up to 4.5A or even greater. The present disclosure is not particularly limited to the normal charging mode. As long as the power adapter is operable in two charging modes, the charging speed (or current) of one of the charging modes is greater than that of the other, the charging mode having a slower charging speed can be considered as the normal charging mode. In terms of charging power, the charging power in the quick charging mode can be greater than or equal to 15 W.

That is, the control unit 107 communicates with the terminal 2 via the first charging interface 105 to determine the charging mode, the charging mode including the normal charging mode and the quick charging mode.

As one implementation, the power adapter and the terminal are coupled with each other through a universal serial bus (USB) interface; the USB interface can be a normal USB interface or a micro USB interface. The data wire in the USB interface, that is, the data wire in the first charging interface, is used for two-way communication between the power adapter and the terminal. The data wire can be at least of the D+ line and the D− line in the USB interface. The term "two-way communication" may refer to information interaction between the power adapter and the terminal.

The power adapter performs two-way communication with the terminal through the data wire in the USB interface, to determine that terminal will be charged with the quick charging mode.

It should be noted that, during the negotiating process between the power adapter and the terminal, the power adapter can be just connected to the terminal without charging the terminal or the power adapter can charge the terminal with the normal charging mode or with a small current, the present disclosure is not limited thereto.

The power adapter is configured to adjust the charging current to one corresponding to the quick charging mode to charge the terminal. After determining that the quick charging mode will be used to charge the terminal, the power adapter can adjust the charging current directly to the charging current corresponding to the quick charging mode or can negotiate with the terminal the charging current of the quick charging mode. For example, the power adapter can determine the charging current corresponding to the quick charging mode based on the current power of the battery of the terminal.

In the implementation, the power adapter does not blindly step up the output current for quick charging. Instead, the power adapter performs two-way communication with the terminal to negotiate whether the quick charging mode can be used, which improves the security of the quick charging process compared to the related art.

In an implementation, when the control unit 107 performs two-way communication with the terminal through the data wire in the first charging interface to determine that the terminal will be charged with the quick charging mode, the control unit transmits a first instruction to the terminal which is configured to inquire the terminal whether the quick charging mode is to be enabled; and then the control unit receives from the terminal a reply instruction responsive to the first instruction, where the reply instruction responsive to the first instruction is configured to indicate that the terminal agrees to enable the quick charging mode.

In an implementation, before the control unit sends the first instruction to the terminal, the power adapter may charge the terminal with the normal charging mode and transmit the first instruction to the terminal when the control unit determines that the charging duration of the normal charging mode is greater than a preset threshold.

It should be noted that, after the power adapter determines that the charging duration of the normal charging mode exceeds the preset threshold, the power adapter can consider that the terminal has identified it as a power adapter and quick charging inquiry communication can be initiated.

In an implementation, the power adapter can transmit the first instruction to the terminal after determining that a charging current that is greater than or equal to a preset current threshold will be used for charging for a preset time period.

In an implementation, the control unit is further configured to control the switch unit to control the power adapter to adjust the charging current to one corresponding to the quick charging mode. Before the power adapter charges the terminal with the charging current corresponding to the quick charging mode, the control unit performs two-way communication with the terminal through the data wire in the first charging interface to determine the charging voltage corresponding to the quick charging mode and control the power adapter to adjust the charging voltage to one corresponding to the quick charging mode.

In an implementation, when the control unit conducts two-way communication with the terminal through the data wire in the first charging interface to determine the charging voltage corresponding to the quick charging mode, the control unit transmits a second instruction to the terminal, and the second instruction is configured to inquire whether the current output voltage of the power adapter is suitable as the charging voltage of the quick charging mode. The control unit receives from the terminal a reply instruction responsive to the second instruction, where the reply instruction responsive to the second instruction is configured to indicate that the current output voltage of the power adapter is appropriate, high, or low. The control unit determines the charging voltage of the quick charging mode based on the reply instruction responsive to the second instruction.

In an implementation, before the control unit controls the power adapter to adjust the charging current to one corresponding to the quick charging mode, the control unit conducts two-way communication with the terminal through the data wire in the first charging interface, to determine the charging current corresponding to the quick charging mode.

As one implementation, when the control unit conducts two-way communication with the terminal through the data wire in the first charging interface to determine the charging current corresponding to the quick charging mode. The control unit sends a third instruction to the terminal that is configured to inquire the maximum charging current currently supported by the terminal. The control unit receives from the terminal a reply instruction responsive to the third instruction, the reply instruction responsive to the third instruction is configured to indicate the maximum charging current currently supported by the terminal. The control unit determines the charging current of the quick charging mode based on the reply instruction responsive to the third instruction.

The power adapter can directly determine the maximum charging current as the charging current with the quick charging mode, or the power adapter can set the charging current to a certain current value smaller than the maximum charging current.

In an implementation, when charging the terminal under the quick charging mode by the power adapter, the control unit conducts two-way communication with the terminal through the data wire in the first charging interface, so as to continuously adjust the charging current output from the power adapter to the battery by controlling the switch unit.

The power adapter can continually inquire about the current status information of the terminal. For example, it can inquire the terminal for battery voltage (that is, voltage across the battery or voltage applied to both ends of the battery), battery power, and so on, so as to continuously adjust the charging current output from the power adapter to the battery.

As one implementation, when the control unit conducts two-way communication with the terminal through the data wire in the first charging interface to continuously adjust the charging current output from the power adapter to the battery by controlling the switch unit, the control unit transmits a fourth instruction to the terminal that is configured to inquire the current voltage of the battery within the terminal. The control unit receives from the terminal a reply instruction responsive to the fourth instruction, which is configured to indicate the current voltage of the battery within the terminal. The control unit continuously adjusts the charging current output from the power adapter to the battery by controlling the switch unit, based the current battery voltage.

In an implementation, based on the current voltage of the battery and a preset correspondence between battery voltage values and charging current values, the control unit adjusts a charging current output to the battery from the power adapter to one corresponding to the current battery voltage by the controlling the switch unit.

The power adapter can pre-store the correspondence between battery voltage values and charging current values. The power adapter can conduct two-way communication with the terminal through the data wire in the first charging interface to acquire from the terminal the correspondence between the battery voltage values and the charging current values stored in the terminal.

In an implementation, in the process of charging the terminal with the quick charging mode by the power adapter, the control unit further conducts two-way communication with the terminal through the data wire in the first charging interface to determine whether the first charging interface and the second charging interface are in a poor contact. When the control unit determines that the first charging interface and the second charging interface are in a poor contact, the control unit controls the power adapter to quit the quick charging mode.

In an implementation, before determining whether the first charging interface and the second charging interface are in a poor contact with each other, the control unit is further configured to receive from the terminal the information indicating the path impedance of the terminal. In particular, the control unit transmits a fourth instruction to the terminal, where the fourth instruction is configured to inquire the voltage of the battery within the terminal. The control unit receives, from the terminal, a reply instruction responsive to the fourth instruction that is configured to indicate the voltage of the battery of the terminal. The control unit determines the path impendence from the power adapter to the battery based on the output voltage of the power adapter and the battery voltage. The control unit determines whether the first charging interface and the second charging interface are in a poor contact based on the path impedance from the power adapter to the battery, the path impedance of the terminal, and the path impedance of a charging circuit between the power adapter and the terminal.

The terminal can record its path impedance in advance. For example, as the same type of terminal has the same structure, the path impedance of the same type of terminals can be set to the same value when making factory settings. Similarly, the power adapter can record the path impedance of the charging circuit in advance. When the power adapter acquires the voltage across the battery of the terminal, it can determine the path impedance of the entire path according to the voltage drop from the power adapter to both ends of the battery and path current. When the path impedance of the entire path>the path impedance of the terminal+the path impedance of the charging circuit, or, when the path impedance of the entire path−(the path impedance of the terminal+ the path impedance of the charging circuit)>an impedance threshold, it may be considered that the first charging interface and the second charging interface are in a poor contact.

In an implementation, before the power adapter quits the quick charging mode, the control unit transmits a fifth instruction to the terminal that is configured to indicate that the first charging interface and the second charging interface are in a poor contact. After transmitting the fifth instruction, the power adapter can quit the quick charging mode or be reset.

The quick charging process according to the implementation of the present disclosure has been described in detail from the viewpoint of the power adapter, and below it will be described from the viewpoint of the terminal.

It should be noted that, interaction between the power adapter and the terminal and related features and functions thereof descried with respect to the terminal correspond to those descried with respect to the power adapter, and for the sake of brevity, the overlapping description is properly omitted.

Figure 13:
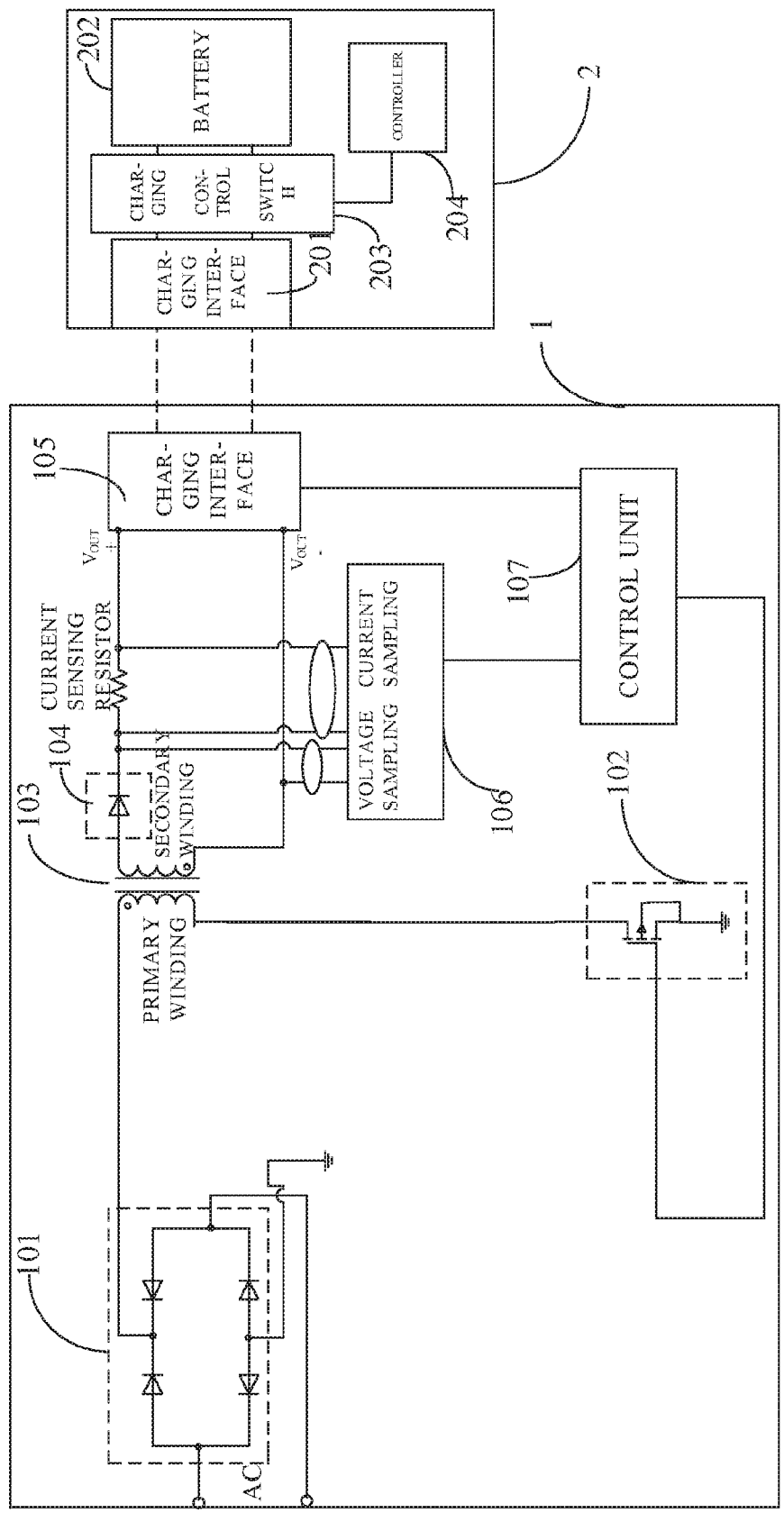
FIG. 13 is a block diagram illustrating a terminal according to an implementation of the disclosure.

According to an implementation of the present disclosure, as illustrated in FIG. 13, the terminal 2 further includes a charging control switch 203 and a controller 204. The charging control switch 203 may be a switch circuit constituted by, for example, an electronic switching device, and is coupled between the second charging interface 201 and the battery 202. Under the control of the controller 204, the charging control switch 203 can switch on or off the charging process of the battery 202. In this way, the charging process of the battery 202 can be controlled from the terminal side, so as to ensure the safety and reliability of the battery 202.

Figure 14:
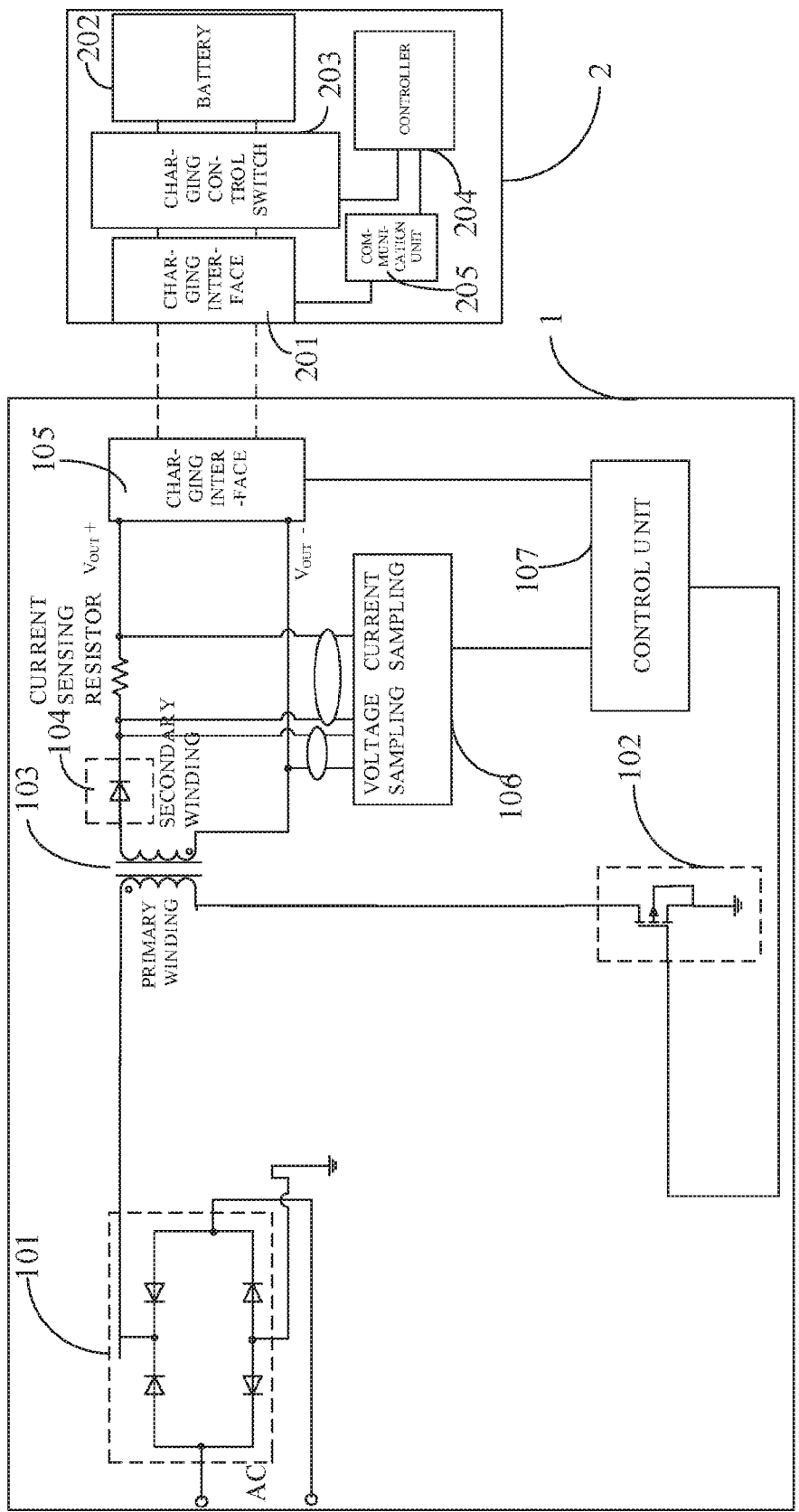
FIG. 14 is a block diagram illustrating a terminal according to another implementation of the disclosure.

As illustrated in FIG. 14, the terminal 2 further includes a communication unit 205 configured to establish two-way communication between the controller 204 and the control unit 107 via the second charging interface 201 and the first charging interface 105. That is, the terminal 2 and the power adapter 1 can conduct two-way communication via the data wire in the USB interface. The terminal 2 is operable in the normal charging mode and the quick charging mode. The charging current of the quick charging mode is greater than that of the normal charging mode. The communication unit 205 and the control unit 107 conducts two-way communication whereby the power adapter 1 determines to charge the terminal 2 with the quick charging mode, such that the control unit 107 controls the power adapter 1 to output according to the charging current corresponding to the quick charging mode to charge the battery 202 in the terminal 2.

In the implementation of the present disclosure, the power adapter 1 does not blindly step up the output current for quick charging. Instead, the power adapter 1 conducts two-way communication with the terminal 2 to negotiate whether the quick charging mode can be used. Compared with the related art, the security of the quick charging process is improved.

In an implementation, the controller receives a first instruction from the control unit through a communication unit, where the first instruction is configured to inquire the terminal whether the quick charging mode is to be enabled. The controller transmits a reply instruction responsive to the first instruction to the control unit through the communication unit, where the reply instruction responsive to the first instruction is configured to indicate that the terminal agrees to enable the quick charging mode.

Optionally, in an implementation, before the controller receives the first instruction from the control unit through the communication unit, the power adapter charges the battery of the terminal with the normal charging mode. When the control unit determines that the charging duration of the normal charging mode exceeds a preset threshold, the control unit transmits the first instruction to the communication unit of the terminal, and the controller receives the first instruction from the control unit through the communication unit.

Optionally, in an implementation, the power adapter makes outputs based on the charging current corresponding to the quick charging mode, whereby before charging the battery of the terminal, the controller conducts two-way communication with the control unit through the communication unit, such that the power adapter determines the charging voltage corresponding to the quick charging mode.

In an implementation, the controller receives a second instruction from the control unit, where the second instruction is configured to inquire whether the current output voltage of the power adapter is suitable as the charging voltage of the quick charging mode. The controller transmits a reply instruction responsive to the second instruction to the control unit, where the reply instruction responsive to the second instruction is configured to indicate that the current output voltage of the power adapter is appropriate, high, or low.

In an implementation, the controller conducts two-way communication with the control unit, whereby the power adapter determines the charging current corresponding to the quick charging mode.

The controller receives a third instruction from the control unit, where the third instruction is configured to inquire the maximum charging current currently supported by the terminal. The controller transmits a reply instruction responsive to the third instruction to the control unit, where the reply instruction responsive to the third instruction is configured to indicate the maximum charging current currently supported by the battery of the terminal, whereby the power adapter determines the charging current of the quick charging mode according to the maximum charging current.

Optionally, in an implementation, in the process of charging the terminal with the quick charging mode by the power adapter, the controller conducts two-way communication with the control unit, whereby the power adapter continuously adjust the charging current output from the power adapter to the battery.

The controller receives a fourth instruction from the control unit, where the fourth instruction is configured to inquire the current voltage of the battery within the terminal. The controller transmits a reply instruction responsive to the fourth instruction to the control unit, where the reply instruction responsive to the fourth instruction is configured to indicate the current voltage of the battery of the terminal, whereby the power adapter continuously adjusts the charging current output from the power adapter to the battery according to the current voltage of the battery.

In an implementation, in the process of charging the terminal with the quick charging mode by the power adapter, the controller conducts two-way communication with the control unit through the communication unit, whereby the power adapter determines whether the first charging interface and the second charging interface are in a poor contact.

The controller receives the fourth instruction from the control unit, where the fourth instruction is configured to inquire the current voltage of the battery within the terminal. The controller transmits the reply instruction responsive to the fourth instruction to the control unit, where the reply instruction responsive to the fourth instruction is configured to indicate the current voltage of the battery of the terminal, whereby the control unit determines whether the first charging interface and the second charging interface are in a poor contact according to the output voltage of the power adapter and the current voltage of the battery.

In an implementation, the controller receives a fifth instruction from the control unit, where the fifth instruction is configured to indicate that the first charging interface and the second charging interface are in a poor contact.

Figure 6:
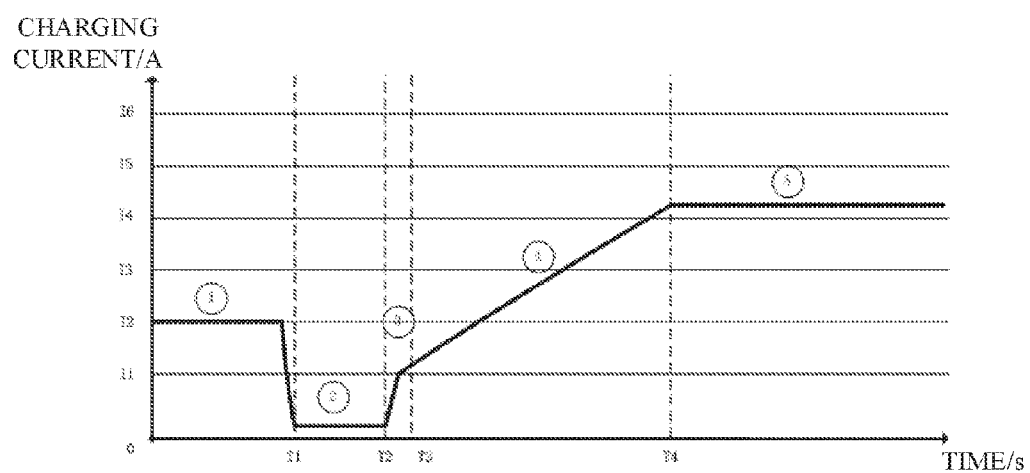
FIG. 6 is a schematic diagram illustrating a quick charging process according to an implementation of the disclosure.

In order to enable the quick charging mode, the power adapter can communicate with the terminal for quick charging. After one or more handshakes, quick charging of the battery can be achieved. The quick charging communication procedure according to the implementation of the disclosure as well as various stages of the quick charging process will be described in detail with reference to FIG. 6. It should be noted that, the communication actions or operations illustrated in FIG. 6 are merely examples, and implementations of the disclosure may also perform other operations or variations of the various operations illustrated in FIG. 6. In addition, the various stages illustrated in FIG. 6 may be performed in different orders than that illustrated in FIG. 6, and it may not be necessary to perform all the operations as illustrated in FIG. 6. It should be noted that, the curve in FIG. 6 represents changes in the peaks or average values of the charging current, rather than the actual charging current curve.

As illustrated in FIG. 6, the quick charging process can include five stages, namely, stage 1 to stage 5.

Stage 1

After being connected with a power supply device, the terminal can detect the type of the power supply device through the data wire D+ and D−. When the terminal detects that the power supply device is a power adapter, the current absorbed by the terminal can be greater than a preset current threshold I2 (for example, 1A). When the power adapter detects that the output current of the power adapter within a preset time period (for example, a continuous period of time T1) is greater than or equal to I2, the power adapter considers the terminal to have completed the type identification of the power supply device, and starts the handshake communication between the adapter and the terminal. The power adapter transmits Instruction 1 (corresponding to the first instruction) to inquire the terminal whether the quick charging mode (also known as flash charging) is to be enabled.

When the power adapter receives from the terminal a reply instruction indicating that the terminal does not agree to enable the quick charging mode, the power adapter will detect again the output current of the power adapter; when the output current of the power adapter is still greater than or equal to I2 in the preset continuous duration (for example, a continuous length of time T1), the power adapter will again initiate a request to inquire the terminal whether the quick charging mode is to be enabled. The foregoing actions of stage 1 will be repeated until the terminal agrees to enable the quick charging mode or the output current of the power adapter is no longer greater than or equal to I2.

After the terminal agrees to enable the quick charging mode, the quick charging process is switched on. The quick charging communication procedure proceeds to stage 2.

Stage 2

For the voltage of the steamed-bun shaped waveform output from the power adapter, there can be multiple levels. The power adapter transmits Instruction 2 (corresponding to the second instruction) to the terminal to inquire whether the output voltage of the power adapter matches the current voltage of the battery, or, whether the output voltage of the power adapter is suitable, that is, whether it is suitable as the charging voltage of the quick charging mode, namely, whether the output voltage of the power adapter meets the charging requirements.

The terminal replies that the output voltage of the power adapter is high, low, or matching. When the power adapter receives a feedback from the terminal that the output voltage of the adapter is high or low, the control unit adjusts the duty ratio of the PWM signal to adjust the output voltage of the power adapter by one level. The power adapter again transmits Instruction 2 to the terminal and re-inquires the terminal whether the output voltage of the power adapter matches.

The power adapter repeats the forgoing actions until the terminal replies to the power adapter that the output voltage of the power adapter is at a matching level. The quick charging communication procedure proceeds to stage 3.

Stage 3

After the power adapter receives a feedback from the terminal that the output voltage of the power adapter is matched, the power adapter transmits Instruction 3 (corresponding to the third instruction) to the terminal to inquire the maximum charging current currently supported by the terminal. The terminal responds to the power adapter the maximum charging current value currently supported by the terminal. The quick charging communication procedure proceeds to stage 4.

Stage 4

After the power adapter receives from the terminal the response about the currently supported maximum charging current value of the terminal, the power adapter can set a reference value for the output current thereof. The control unit 107 adjusts the duty ratio of the PWM signal according to this current reference value, such that the output current of the power adapter meets the requirements of the charging current of the terminal; namely, the quick charging communication procedure proceeds to a constant-current charging stage. Here in the constant-current charging stage referring to the peak or average value of the output current of the power adapter remains essentially unchanged, namely, the magnitude of change of the peak or average value of the output current is small (such as in the range of 5% of the peak or average value of the output current). That is to say, the current peak value of the third pulsating waveform remains constant in each cycle.

Stage 5

When the quick charging communication procedure proceeds to the constant-current changing stage, the power adapter sends Instruction 4 (corresponding to the fourth instruction) at intervals to inquire the current voltage of the battery of the terminal. The terminal feeds back the current voltage of the battery of the terminal to the power adapter. Based on the feedback of the current voltage of the battery of the terminal, the power adapter can judge whether the first charging interface and the second charging interface are in a good contact and whether it is required to reduce the current charging current value of the terminal. When the power adapter judges that the USB is in a poor contact, the power adapter transmits Instruction 5 (corresponding to the fifth instruction) and then resets to re-proceed to stage 1.

Optionally, in some implementations, at stage 1, when the terminal responding to Instruction 1, the data (or information) that corresponds to path impedance of the terminal can be attached to the data corresponding to Instruction 1. At stage 5, the data of the path impedance of the terminal can be used to determine whether the USB is in a good contact.

Optionally, in some implementations, at stage 2, the time period from the point when the terminal agrees to enable the quick charging mode to the point when the power adapter adjusts the voltage to an appropriate value can be controlled within a certain range. If the time exceeds the certain range, the terminal can judge that the request is an abnormal one and a quick reset is made.

Optionally, in some implementations, at stage 2, when the output voltage of the power adapter is adjusted to a voltage that is ΔV (which is about 200~500 mV) higher compared with the current voltage of the battery, the terminal makes a feedback in terms of whether the output voltage of the power adapter is appropriate or matching to the power adapter. When the output voltage of the power adapter is not suitable (that is, high, or low), as fed back to the power adapter by the terminal, the control unit 107 adjusts the duty ratio of the PWM signal based on the voltage sampling value, so as to adjust the output voltage of the power adapter.

Optionally, in some implementations, at stage 4, the adjusting speed of the magnitude of the output current value of the power adapter can be controlled within a certain range; as such, abnormal interrupt caused by excessive adjustment speed can be avoided.

In some implementations, at stage 5, if the magnitude of change of the output current of the power adapter can be controlled in the range of 5%, it can be considered as in the constant-current charging stage.

Optionally, in some implementations, at stage 5, the power adapter monitors the impedance of a charging loop in real time. That is, the power adapter monitors the output voltage of the power adapter, the current charging current, and a read battery voltage of the terminal to monitor the impedance of the entire charging loop. When the impedance of the charging loop>the path impedance of the terminal+the impedance of a quick charging data wire, the power adapter can consider that the USB is in a poor contact and a quick charging reset is made.

Optionally, in some implementations, after the quick charging mode is switched on, the interval of communication between the power adapter and the terminal can be controlled within a certain range to avoid quick charging reset.

Optionally, in some implementations, the termination of the quick charging mode (or the quick charging process) may be a recoverable or unrecoverable termination.

For example, when the terminal detects that the battery is fully charged or the USB is in a poor contact, the quick charging is stopped and reset to proceed to stage 1; otherwise if the terminal does not agree to enable the quick charging mode, the quick charging communication procedure would not proceed to stage 2. Herein, this kind of termination of the quick charging process can be referred to as an "unrecoverable termination".

In another example, when the communication between the terminal and the power adapter is abnormal, the quick charging is stopped and reset to proceed to stage 1. After the requirements of stage 1 is met, the terminal agrees to enable the quick charging mode to restore the quick charging process; here, this kind of termination of the quick charging process can be referred to as a "recoverable termination".

For example, when the terminal detects that the battery is abnormal, the quick charging is terminated and reset to proceed to stage 1; after entering stage 1, the terminal does not agree to enable the quick charging mode. Until the battery returns to normal and meets the requirements of stage 1, the terminal agrees to enable the quick charging mode to restore the quick charging process. Here, this kind of termination of the quick charging process can be referred to as a "recoverable termination".

It is to be noted that the above-described communication actions or operations illustrated in FIG. 6 are merely examples. For example, at stage 1, after being connected with the power adapter, the handshake communication between the terminal and the power adapter can be initiated by the terminal as well. That is, the terminal transmits Instruction 1 to inquire the adapter whether to enable the quick charging mode (in other words, flash charging). When the terminal receives from the power adapter a reply instruction indicating that the power adapter agrees to enable the quick charging mode, the quick charging mode would be enabled accordingly.

It should be noted that, the above-described communication actions or operations illustrated in FIG. 6 are merely examples. For example, after stage 5, a constant-voltage charging stage can be further included. That is, at stage 5, the terminal can feed back the current voltage of the battery of the terminal to the power adapter. As the voltage of the battery of the terminal continues to rise, when the current voltage of the battery of the terminal reaches the constant-voltage charging voltage threshold, the charging process proceeds to the constant-voltage charging stage, and the control unit 107 adjusts the duty ratio of the PWM signal based on the reference voltage value (that is, the constant-voltage charging voltage threshold), such that the output voltage of the power adapter meets the requirements of the charging voltage of the terminal, that is, the change of the voltage is kept constant substantially. At the constant-voltage charging stage, the charging current gradually steps down, and the charging will be terminated when the current steps down a certain threshold, and at this point, it indicates that the battery has been fully charged. The term "constant-voltage charging" means that the peak voltage of the third pulsating waveform remains substantially constant.

It should be noted that, in implementations of the present disclosure, the output voltage of the power adapter refers to the peak voltage or average voltage value of the third pulsating waveform, and the output current of the power adapter refers to the peak current or average current value of the third pulsating waveform.

Figure 7A:
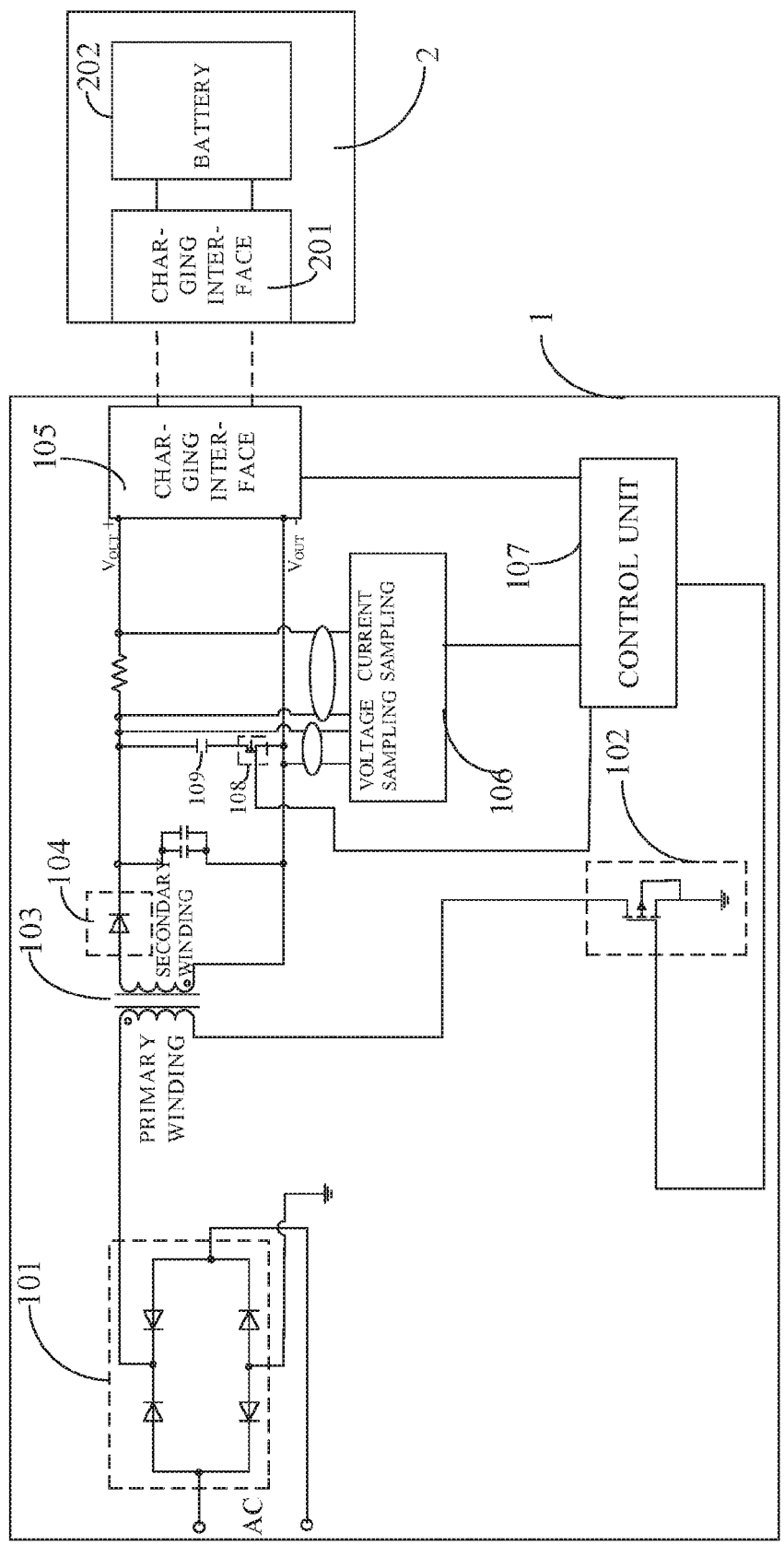
FIG. 7A is a block diagram illustrating a charging system according to an implementation of the disclosure.
Figure 7B:
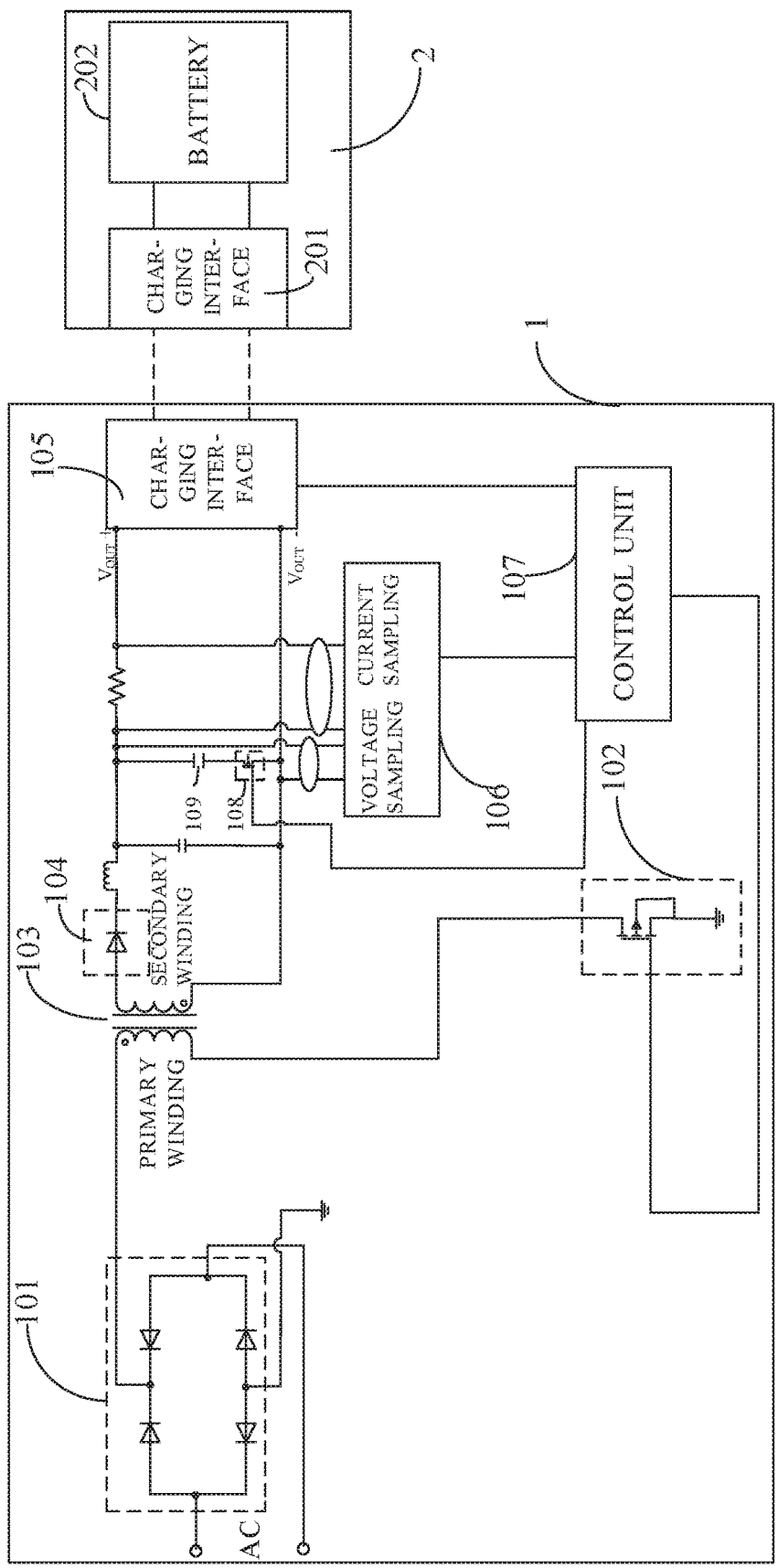
FIG. 7B is a block diagram illustrating a power adapter incorporating an LC filter circuit according to an implementation of the disclosure.

In one implementation of the present disclosure, as illustrated in FIG. 7A, the controllable switch 108 and the filter unit 109 are coupled in series. The serially coupled controllable switch 108 and filter unit 109 are coupled to a first output end of the second rectification unit 104. The control unit 107 is further configured to control the controllable switch 108 to be switched on when determining that the charging mode is the normal charging mode, and to control the controllable switch 108 to be switched off when determining that the charging mode is the quick charging mode. The output end of the second rectification unit 104 can be further coupled with one or more sets of small capacitors, which can not only reduce noise but can reduce the occurrence of surge. In one implementation, the output end of the second rectification unit 104 can be further coupled with a LC filter circuit or a π-type filter circuit so as to filter wave interference. As illustrated in FIG. 7B, a LC filter circuit is coupled to the output end of the second rectification unit 104. It should be noted that, capacitors in the LC filter circuit and the π-type filter circuit are all small capacitors and therefore occupy a small space.

The filter unit 109 includes a filtering capacitor, which is operable in a standard charging of 5V corresponding to the normal charging mode. The controllable switch 108 may be formed of a semiconductor switch element such as a MOS transistor. When the power adapter charges the battery in the terminal in the normal charging mode (or standard charging), the control unit 107 controls the controllable switch 108 to switch on to incorporate the filter unit 109 into the circuit, such that the output of the second rectification unit 104 can be filtered. This allows for better compatibility with direct current charging technology, i.e., the direct current can be applied to the battery in the terminal to achieve the direct current charging of the battery. For example, in general, the filter unit includes an electrolytic capacitor and a common capacitor such as a small capacitor supporting standard charging of 5V (for example, a solid-state capacitor) coupled in parallel. Since the electrolytic capacitor occupies a relatively large volume, to reduce the size of the power adapter, the electrolytic capacitor may be removed from the power adapter and only one capacitor with low capacitance will be left. When the normal charging mode is adopted, a branch where the small capacitor is located can be controlled to switch on to filter the current, so as to achieve a stable low power output to perform a direct current charging of the battery. When the quick charging mode is adopted, a branch where the small capacitor is located can be controlled to switch off, and the output of the second rectification unit 104, that is, the voltage/current of pulsating waveforms, can be directly applied to the battery without filtering, so as to achieve quick charging of the battery.

According to an implementation of the present disclosure, the control unit 107 is further configured to obtain the charging current and/or the charging voltage corresponding to the quick charging mode according to the status information of the terminal and to adjust the duty ratio of the control signal such as the PWM signal based on the charging current and/or the charging voltage corresponding to the quick charging mode, when determining the charging mode as the quick charging mode. In other words, when determining that the current charging mode is the quick charging mode, the control unit 107 obtains the charging current and/or the charging voltage corresponding to the quick charging mode according to the obtained status information of the terminal such as the voltage, the power and the temperature of the battery, running parameters of the terminal, and power consumption information of applications running on the terminal, and adjusts the duty ratio of the control signal according to the obtained charging current and/or the charging voltage, such that the output of the power adapter meets the charging requirements, thus achieving quick charging of the battery.

The status information of the terminal includes the temperature of the battery. When the temperature of the battery is greater than a first predetermined temperature threshold, or the temperature of the battery is lower than a second predetermined temperature threshold, if the current charging mode is the quick charging mode, it will be switched to the normal charging mode from the quick charging mode. The first predetermined temperature threshold is greater than the second predetermined temperature threshold. In other words, when the temperature of the battery is too low (for example, corresponding to less than the second predetermined temperature threshold) or too high (for example, corresponding to greater than the first predetermined temperature threshold), it is unsuitable to perform quick charging, and it needs to switch from the quick charging mode to the normal charging mode. In implementations of the present disclosure, the first predetermined temperature threshold and the second predetermined temperature threshold can be set or can be written into a storage of the control unit (such as the MCU of the power adapter) according to actual needs.

In an implementation of the present disclosure, the control unit 107 is further configured to control the switch unit 102 to switch off when the temperature of the battery is greater than a predetermined high-temperature protection threshold. Namely, when the temperature of the battery exceeds the high-temperature protection threshold, the control unit 107 needs to apply a high-temperature protection strategy to control the switch unit 102 to switch off, such that the power adapter stops charging the battery, thus can achieve high-temperature protection of the battery and improve the charging safety. The high-temperature protection threshold may be different from or the same as the first temperature threshold. In an implementation, the high-temperature protection threshold is greater than the first temperature threshold.

In another implementation of the present disclosure, the controller is further configured to obtain the temperature of the battery, and to control the charging control switch to switch off when the temperature of the battery is greater than the predetermined high-temperature protection threshold, that is, the charging control switch can be switched off at the terminal side, so as to stop the charging process of the battery and to ensure the charging safety.

Moreover, in an implementation of the present disclosure, the control unit is further configured to obtain a temperature of the first charging interface, and to control the switch unit to switch off when the temperature of the first charging interface is greater than a predetermined protection temperature. In other words, when the temperature of the charging interface exceeds a certain temperature, the control unit 107 needs to apply the high-temperature protection strategy to control the switch unit 102 to switch off, such that the power adapter stops charging the battery, thus achieving high-temperature protection of the charging interface and improving the charging safety.

Certainly, in another implementation of the present disclosure, the controller performs the two-way communication with the control unit to obtain the temperature of the first charging interface. When the temperature of the first charging interface is greater than the predetermined protection temperature, the controller controls the charging control switch to switch off (referring to FIG. 13 and FIG. 14), i.e., switch off the charging control switch at the terminal side, so as to stop the battery charging process , thus ensuring the charging safety.

Figure 8:
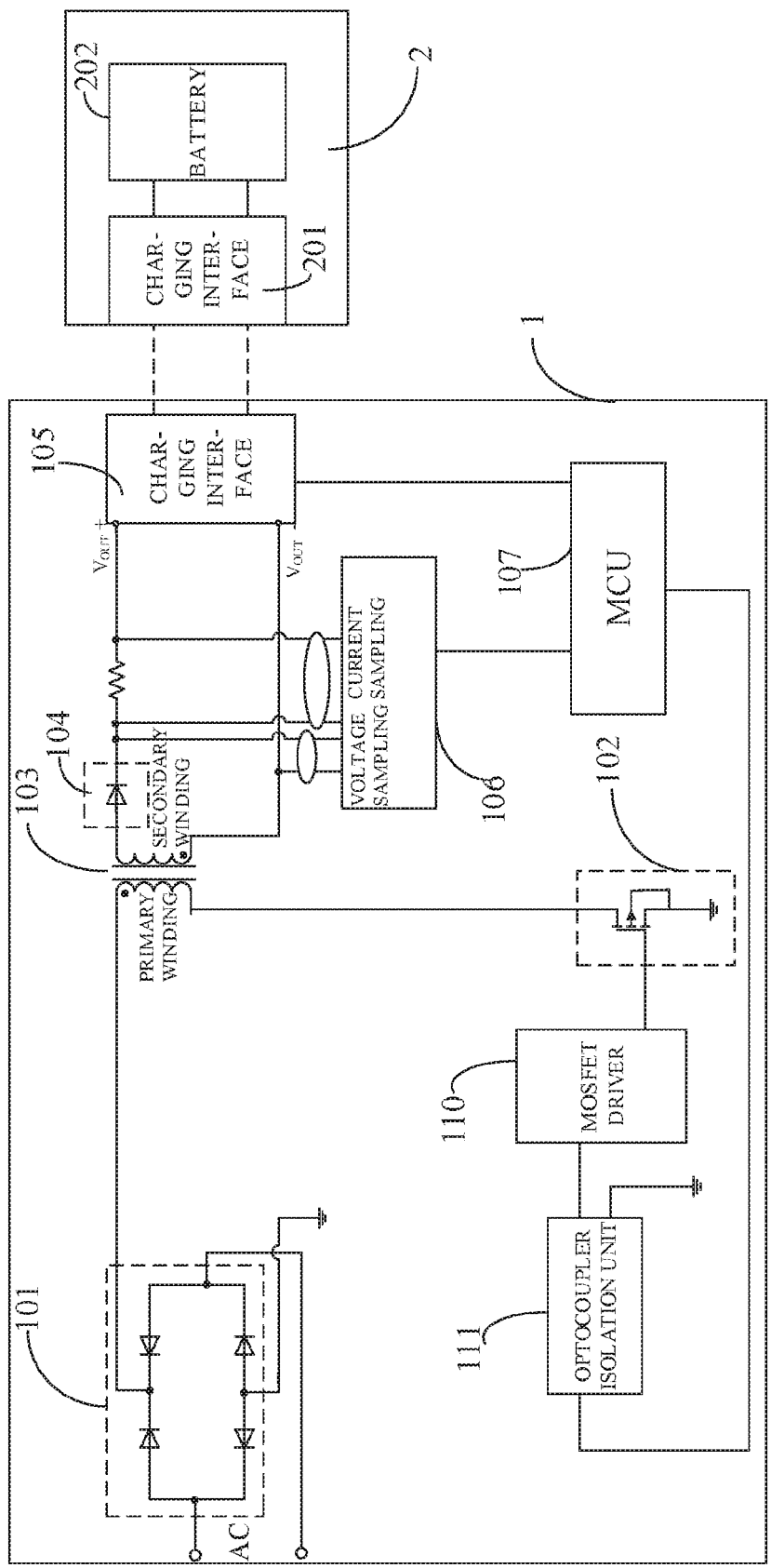
FIG. 8 is a block diagram illustrating a charging system according to another implementation of the disclosure.

In detail, in an implementation of the present disclosure, as illustrated in FIG. 8, the power adapter 1 further includes a driving unit 110 such as a MOSFET driver. The driving unit 110 is coupled between the switch unit 102 and the control unit 107. The driving unit 110 is configured to drive the switch unit 102 to switch on or switch off according to the control signal. Certainly, it should be noted, in other implementations of the present disclosure, the driving unit 110 may also be integrated in the control unit 107.

Further, as illustrated in FIG. 8, the power adapter 1 further includes an isolation unit 111. The isolation unit 111 is coupled between the driving unit 110 and the control unit 107, to realize signal isolation between the primary side and the secondary side of the power adapter 1 (or signal isolation between the primary winding and the secondary winding of the transformer 103). The isolation unit 111 may be implemented in an optocoupler isolation manner, or in other isolation manners. By providing the isolation unit 111, the control unit 107 may be disposed at the secondary side of the power adapter 1 (or the secondary winding side of the transformer 103), thereby facilitating communication with the terminal 2, and the space design of the power adapter 1 can be easier and simpler.

Certainly, it should be understood that, in other implementations of the present disclosure, both the control unit 107 and the driving unit 110 can be disposed at the primary side, in this way, the isolation unit 111 can be disposed between the control unit 107 and the sampling unit 106, so as to realize the signal isolation between the primary side and the secondary side of the power adapter 1.

Further, it should be noted that, in implementations of the present disclosure, when the control unit 107 is disposed at the secondary side, an isolation unit 111 is required, and the isolation unit 111 may be integrated in the control unit 107. In other words, when the signal is transmitted from the primary side to the secondary side or from the secondary side to the primary side, an isolation unit is usually required to realize the signal isolation.

Figure 9:
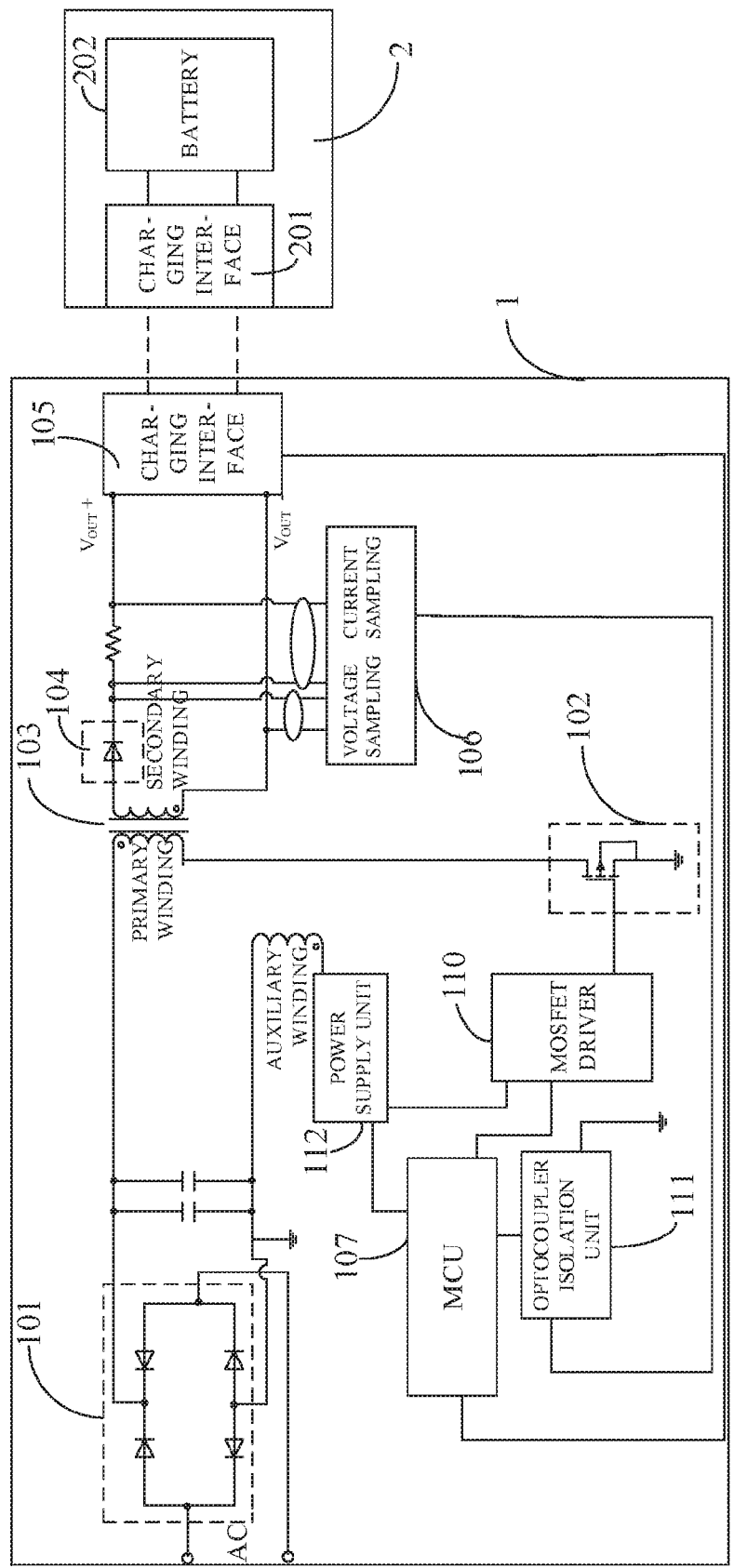
FIG. 9 is a block diagram illustrating a charging system according to yet another implementation of the disclosure.

In an implementation of the present disclosure, as illustrated in FIG. 9, the power adapter 1 further includes an auxiliary winding and a power supply unit 112. The auxiliary winding generates a voltage of a fourth pulsating waveform according to the voltage of the modulated first pulsating waveform. The power supply unit 112 is coupled to the auxiliary winding. The power supply unit 112 (for example, including a filtering voltage regulator module, a voltage converting module, and the like) is configured to convert the voltage of the fourth pulsating waveform to output a direct current, and to supply power to the driving unit 110 and/or the control unit 107 respectively. The power supply unit 112 may be formed of a small filtering capacitor, a voltage regulator chip or other elements, processing and conversion of the voltage of the fourth pulsating waveform can be achieved to output a low voltage direct current of 3.3V, 5V, or the like.

In other words, the power supply of the driving unit 110 can be obtained through a voltage conversion performed on the voltage of the fourth pulsating waveform by the power supply unit 112. When the control unit 107 is disposed at the primary side, the power supply of the control unit 107 can also be obtained through a voltage conversion performed on the voltage of the fourth pulsating waveform by the power supply unit 112. As illustrated in FIG. 9, when the control unit 107 is disposed at the primary side, the power supply unit 112 provides two direct current outputs, so as to supply power to the driving unit 110 and the control unit 107 respectively. An optocoupler isolation unit 111 is arranged between the control unit 107 and the sampling unit 106 to realize the signal isolation between the primary side and the secondary side of the power adapter 1.

When the control unit 107 is disposed at the primary side and integrated with the driving unit 110, the power supply unit 112 supplies power to the control unit 107 separately. When the control unit 107 is disposed at the secondary side and the driving unit 110 is disposed at the primary side, the power supply unit 112 supplies power to the driving unit 110 separately. The power supply to the control unit 107 is realized by the secondary side, for example, the voltage of the third pulsating waveform output from the second rectification unit 104 is converted to a direct current through a power supply unit to power the control unit 107.

Moreover, in implementations of the present disclosure, multiple small capacitors are coupled in parallel to the output end of first rectification unit 101 for filtering. Or a LC filtering circuit is coupled to the output end of the first rectification unit 101.

Figure 10:
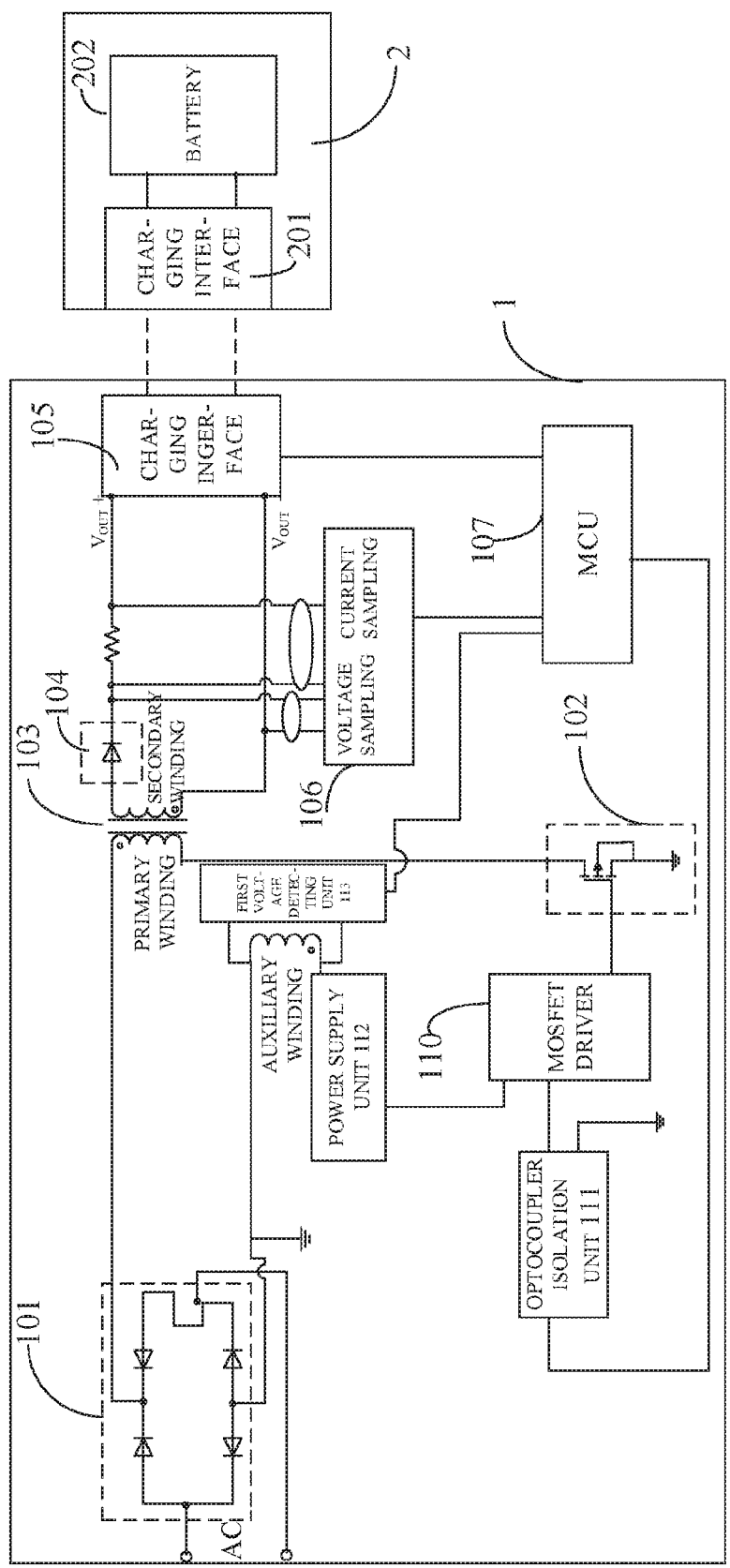
FIG. 10 is a block diagram illustrating a charging system according to still another implementation of the disclosure.

In another implementation of the present disclosure, as illustrated in FIG. 10, the power adapter 1 further includes a first voltage detecting unit 113. The first voltage detecting unit 113 is coupled to the auxiliary winding and the control unit 107 respectively. The first voltage detecting unit 113 is configured to detect the voltage of the fourth pulsating waveform to generate a voltage detection value. The control unit 107 is further configured to adjust the duty ratio of the control signal according to the voltage detection value.

In other words, the control unit 107 may reflect the voltage output from the second rectification unit 104, according to the voltage output from the secondary winding and detected by the first voltage detecting unit 113, and then adjust the duty ratio of the control signal according to the voltage detection value, such that the output of the second rectification unit 104 meets the charging requirements of the battery.

Figure 11:
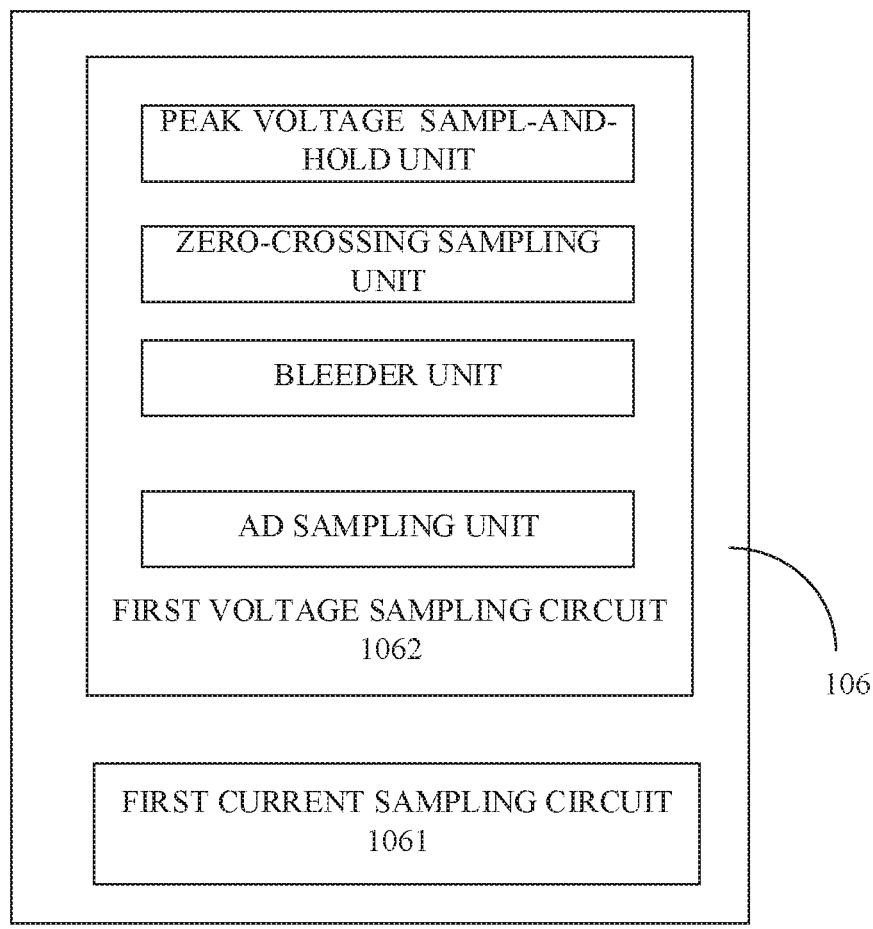
FIG. 11 is a block diagram illustrating a sampling unit according to an implementation of the disclosure.

In detail, in an implementation of the present disclosure, as illustrated in FIG. 11, the sampling unit 106 includes a first current sampling circuit 1061 and a first voltage sampling circuit 1062. The first current sampling circuit 1061 is configured to sample the current output from the second rectification unit 104 so as to obtain the current sampling value. The first voltage sampling circuit 1062 is configured to sample the voltage output from the second rectification unit 104 so as to obtain the voltage sampling value.

In an implementation of the present disclosure, the first current sampling circuit 1061 can sample the voltage across a resistor (current sensing resistor) coupled to a first output end of the second rectification unit 104 so as to sample the current output from the second rectification unit 104. The first voltage sampling circuit 1062 can sample the voltage across the first output end and a second output end of the second rectification unit 104 so as to sample the voltage output from the second rectification unit 104.

Moreover, in an implementation of the present disclosure, as illustrated in FIG. 11, the first voltage sampling circuit 1062 includes a peak voltage sample-and-hold unit, a zero-crossing sampling unit, a bleeder unit, and an AD sampling unit. The peak voltage sample-and-hold unit is configured to sample and hold a peak voltage of the voltage of the third pulsating waveform. The zero-crossing sampling unit is configured to sample a zero-crossing point of the voltage of the third pulsating waveform. The bleeder unit is configured to bleed down the voltage of the peak voltage sample-and-hold unit at the zero-crossing point. The AD sampling unit is configured to sample the peak voltage in the peak voltage sample-and-hold unit so as to obtain the voltage sampling value.

By providing the peak voltage sample-and-hold unit, the zero-crossing sampling unit, the bleeder unit, and the AD sampling unit in the first voltage sampling circuit 1062, the voltage output from the second rectification unit 104 may be sampled accurately, and it can be guaranteed that the voltage sampling value is synchronized with the voltage of the first pulsating waveform, i.e., the phase is synchronized and the variation trend of magnitude of the voltage sampling value is consistent with that of the voltage of the first pulsating waveform.

Figure 12:
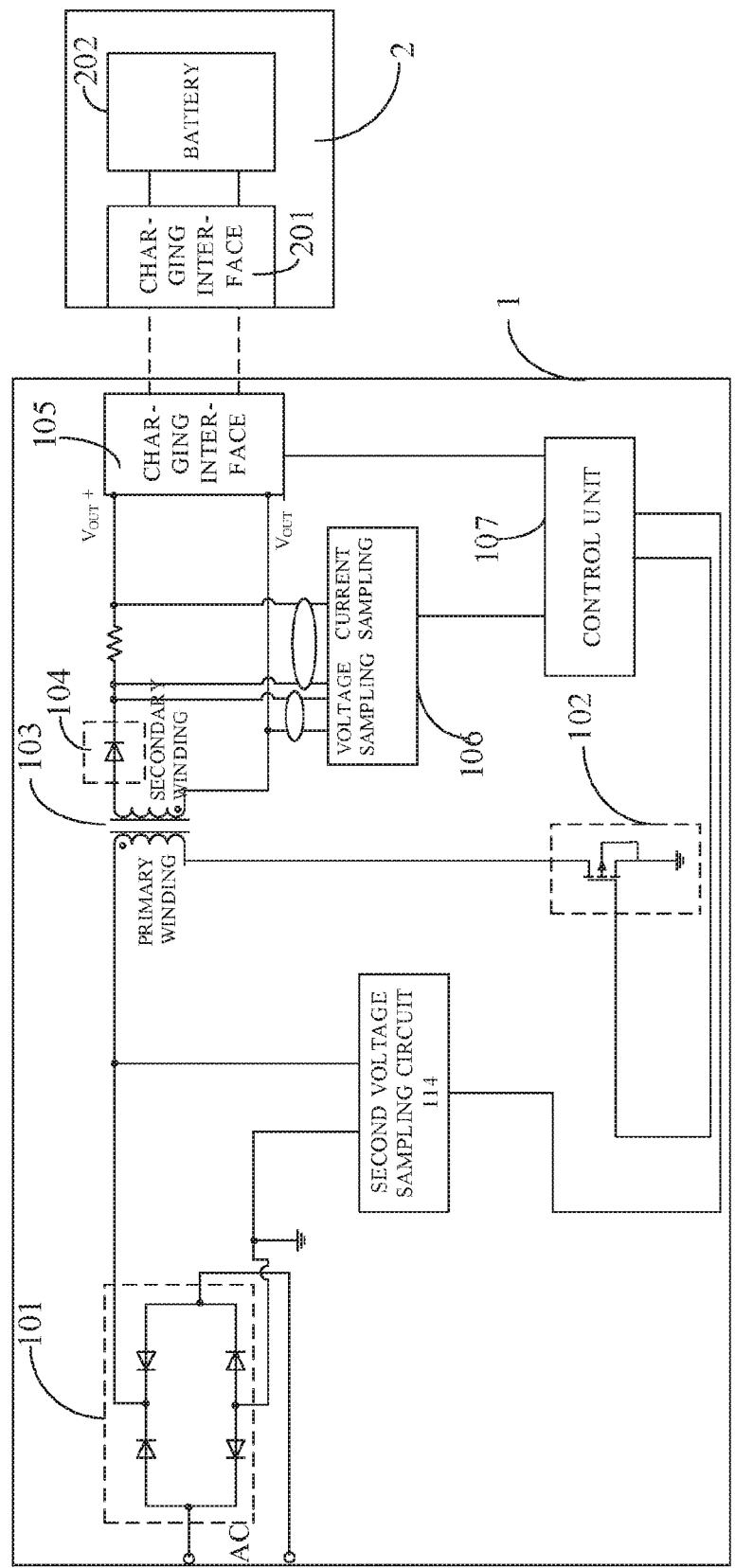
FIG. 12 is a block diagram illustrating a charging system according to a further implementation of the disclosure.

According to an implementation of the present disclosure, as illustrated in FIG. 12, the power adapter 1 further includes a second voltage sampling circuit 114 configured to sample the voltage of the first pulsating waveform. The second voltage sampling circuit 114 is coupled to the control unit 107. When the voltage value sampled by the second voltage sampling circuit 114 is greater than a first predetermined voltage value, the control unit 107 controls the switch unit 102 to switch on for a first predetermined period of time, to bleed down the surge voltage, spike voltage, and the like from the first pulsating waveform.

As illustrated in FIG. 12, the second voltage sampling circuit 114 can be coupled to the first output end and the second output end of the first rectification unit 101, so as to sample the voltage of the first pulsating waveform. The control unit 107 judges the voltage value sampled by the second voltage sampling circuit 114. When the voltage value sampled by the second voltage sampling circuit 114 is greater than the first predetermined voltage value, it indicates that the power adapter 1 is suffering from a lightning interference and so a surge voltage occurs, and at this point, it needs to bleed down the surge voltage to ensure the charging safety and reliability. The control unit 107 controls the switch unit 102 to switch on for a certain time period to form a bleeder path (in other words, bleeder circuit), such that the surge voltage caused by the lightning can be bled down, thus avoiding the lightning interference to the power adapter when charging the terminal, and effectively improving the terminal charging safety and reliability. The first predetermined voltage value may be determined according to actual needs.

In an implementation of the present disclosure, during a process when the power adapter 1 charges the battery 202 in the terminal 2, the control unit 107 is further configured to control the switch unit 102 to switch off when the value of the voltage sampled by the sampling unit 106 is greater than a second predetermined voltage value. Namely, the control unit 107 further judges the magnitude of the value of the voltage sampled by the sampling unit 106. When the value of the voltage sampled by the sampling unit 106 is greater than the second predetermined voltage value, it indicates that the voltage output from the power adapter 1 is too high. At this point, the control unit 107 controls the switch unit 102 to switch off, such that the power adapter 1 stops charging the battery 202 in the terminal 2. In other words, the control unit 107 realizes the over-voltage protection of the power adapter 1 by controlling the switch unit 102 to switch off, thus ensuring the charging safety.

Certainly, in an implementation of the present disclosure, the controller 204 performs two-way communication with the control unit 107 to obtain the value of the voltage sampled by the sampling unit 106 (referring to FIG. 13 and FIG. 14), and controls the charging control switch 203 to switch off when the value of the voltage sampled by the sampling unit 106 is greater than the second predetermined voltage value. Namely, the charging control switch 203 is controlled to switch off at the terminal 2 side, so as to stop the charging process of the battery 202, such that the charging safety can be ensured.

Further, the control unit 107 is further configured to control the switch unit 102 to switch off when the value of the current sampled by the sampling unit 106 is greater than a predetermined current value. In other words, the control unit 107 is further configured to judge the magnitude of the value of the current sampled by the sampling unit 106. When the value of the current sampled by the sampling unit 106 is greater than the predetermined current value, it indicates that the current output from the power adapter 1 is too high. At this time, the control unit 107 controls the switch unit 102 to switch off, such that the power adapter 1 stops charging the terminal. In other words, the control unit 107 realizes the over-current protection of the power adapter 1 by controlling the switch unit 102 to switch off, thus ensuring the charging safety.

Similarly, the controller 204 performs the two-way communication with the control unit 107 to obtain the value of the current sampled by the sampling unit 106 (referring to FIG. 13 and FIG. 14), and controls the charging control switch 203 to switch off when the value of the current sampled by the sampling unit 106 is greater than the predetermined current value. In other words, the charging control switch 203 is controlled to switch off at the terminal 2 side, so as to stop the charging process of the battery 202, thus ensuring the charging safety.

The second predetermined voltage value and the predetermined current value may be set or written into a memory of the control unit (for example, the control unit 107 of the power adapter 1, such as a MCU) according to actual needs.

In implementations of the present disclosure, the terminal may be a mobile terminal such as a mobile phone, a mobile power supply such as a power bank, a multimedia player, a notebook PC, a wearable device, or the like.

With the charging system according to implementations of the present disclosure, the power adapter is controlled to output the voltage of the third pulsating waveform or the second DC, and the voltage of the third pulsating waveform or the second DC output from the power adapter is directly applied to the battery of the terminal, thus quick charging of the battery through the pulsating output voltage/current and normal charging of the battery through the second DC can be achieved, that is, the charging system is compliable with quick charging and normal charging. A magnitude of the pulsating output voltage/current is periodically changed, compared with constant voltage/constant current, lithium precipitation of the lithium battery may be reduced and the service life of the battery may be improved, moreover, the probability and intensity of arcing of a contact of a charging interface may be reduced and the service life of the charging interface may be prolonged. Besides, it is beneficial to reduce polarization effect of the battery, improve charging speed, and reduce heat emitted by the battery, thus ensuring the reliability and safety of the terminal during charging. Moreover, since the voltage output from the power adapter can be a voltage of a pulsating waveform, it may be not necessary to provide an electrolytic capacitor in the power adapter, which will not only realize simplification and miniaturization of the power adapter, but greatly reduces the cost.

Implementations of the present disclosure further provide a power adapter. The power adapter includes a first rectification unit, a switch unit, a transformer, a second rectification unit, a filter unit, a controllable switch, a first charging interface, a sampling unit, and a control unit. The first rectification unit is configured to rectify an input AC and output a voltage of a first pulsating waveform. The switch unit is configured to modulate the voltage of the first pulsating waveform based on a control signal. The transformer is configured to output a voltage of a second pulsating waveform according to the voltage of the modulated first pulsating waveform. The second rectification unit is configured to rectify the voltage of the second pulsating waveform and output a voltage of a third pulsating waveform. The filter unit is configured to filter the voltage of the third pulsating waveform and output a second DC. The controllable switch is configured to control whether the filter unit operates. The first charging interface is configured to apply the voltage of the third pulsating waveform or the second DC to a battery of a terminal via a second charging interface when the first charging interface is coupled to the second charging interface of the terminal, in which the second charging interface is coupled with the battery. The sampling unit is configured to sample the voltage and/or current output from the second rectification unit to obtain a voltage sampling value and/or a current sampling value. The control unit is coupled with the sampling unit, the switch unit, and the controllable switch respectively. The control unit is configured to control the controllable switch to cause the filter unit to operate to output the second DC via the first charging interface. The control unit is further configured to control the controllable switch to cause the filter unit to stop operating to output the voltage of the third pulsating waveform via the first charging interface. The control unit is further configured to output the control signal to the switch unit and adjust a duty ratio of the control signal according to the voltage sampling value and/or current sampling value such that the voltage of the third pulsating waveform or the second DC meets charging requirements.

By means of the power adapter, the voltage of the third pulsating waveform or the second DC can be output via the first charging interface and then applied directly to the battery of the terminal via the second charging interface of the terminal. As such, the battery can be charged quickly and directly with a pulsating output voltage/current or charged normally with the second DC, thus can compatible with quick charging and normal charging. Magnitude of the pulsating output voltage/current is periodically changed, compared to the constant voltage/constant current, it is possible to reduce lithium precipitation of the lithium battery and prolong service life expectancy of the battery. Moreover, in terms of the pulsating output voltage/current, the probability and intensity of arcing of a contact of a charging interface may be reduced and the service life of the charging interface may be prolonged. Besides, it is beneficial to reduce polarization effect of the battery, improve charging speed, and reduce heat emitted by the battery, thus ensuring the reliability and safety of the terminal during charging. Moreover, since the voltage output from the power adapter can be a voltage of a pulsating waveform, it may be not necessary to provide an electrolytic capacitor in the power adapter, which will not only realize simplification and miniaturization of the power adapter, but greatly reduces the cost.

Figure 15:
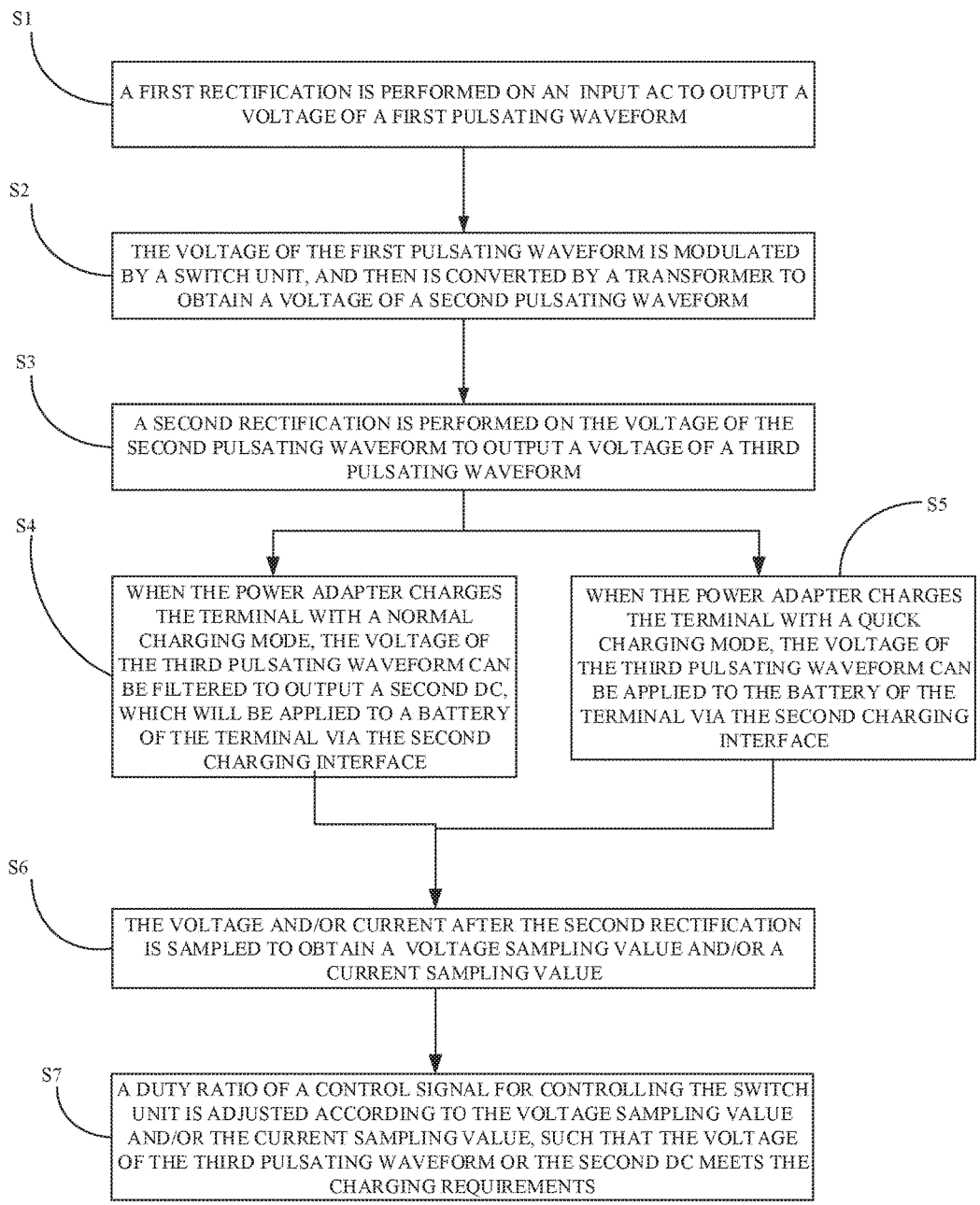
FIG. 15 is a flowchart illustrating a charging method according to an implementation of the disclosure.

FIG. 15 is a flow chart of a charging method according to implementations of the disclosure. As illustrated in FIG. 15, the charging method includes the following operations.

At block S1, when a first charging interface of a power adapter is coupled to a second charging interface of a terminal, a first rectification is performed on an AC input into the power adapter to output a voltage of a first pulsating waveform.

In other words, a first rectification unit in the power adapter rectifies the input AC (i.e., the mains supply, such as an AC of 220V/50 Hz or 60 Hz) and outputs the voltage (for example, 100 Hz or 120 Hz) of the first pulsating waveform, such as a voltage of a steamed-bun shaped waveform.

At block S2, the voltage of the first pulsating waveform is modulated by a switch unit, and then is converted by a transformer to obtain a voltage of a second pulsating waveform.

The switch unit may be composed of a MOS transistor. A PWM control is performed on the MOS transistor to perform a chopping modulation on the voltage of the steamed-bun shaped waveform. Then, the voltage of the modulated first pulsating waveform is coupled to a secondary side by the transformer, such that the secondary winding outputs the voltage of the second pulsating waveform.

In an implementation of the present disclosure, a high-frequency transformer can be used for conversion, thus the size of the transformer can be small, achieving high-power and miniaturization of the power adapter.

At block S3, a second rectification is performed on the voltage of the second pulsating waveform to output a voltage of a third pulsating waveform.

In an implementation of the present disclosure, the second rectification is performed on the voltage of the second pulsating waveform by a second rectification unit. The second rectification unit may be formed of diodes or MOS transistors, and can achieve synchronous rectification at the secondary side, such that the third pulsating waveform can be kept synchronous with the modulated first pulsating waveform.

At block S4, when the power adapter charges the terminal with a normal charging mode, the voltage of the third pulsating waveform can be filtered to output a second DC, which will be applied to a battery of the terminal via the second charging interface to achieve normal charging of the battery.

At block S5, when the power adapter charges the terminal with a quick charging mode, the voltage of the third pulsating waveform can be applied to the battery of the terminal via the second charging interface to achieve quick charging of the battery of the terminal.

At block S6, the voltage and/or current after the second rectification is sampled to obtain a voltage sampling value and/or a current sampling value.

At block S7, a duty ratio of a control signal for controlling the switch unit is adjusted according to the voltage sampling value and/or the current sampling value, such that the voltage of the third pulsating waveform or the second DC meets the charging requirements.

By "the voltage of the third pulsating waveform meets the charging requirements", it may mean that the voltage and current of the third pulsating waveform need to reach the charging voltage and charging current during the charging process of the battery. In other words, the duty ratio of the control signal (such as a PWM signal) can be adjusted based on the sampled voltage and/or current output from the power adapter, so as to adjust the output of the power adapter in real time and thus achieve a closed-loop adjustment control, such that voltage of the third pulsating waveform meets the charging requirements of the terminal, thus ensuring stable and safe charging of the battery. In detail, a waveform of a charging voltage output to a battery is illustrated in FIG. 3, in which the waveform of the charging voltage is adjusted according to the duty ratio of the PWM signal. A waveform of a charging current output to a battery is illustrated in FIG. 4, in which the waveform of the charging current is adjusted according to the duty ratio of the PWM signal. "The second DC meets the charging requirements" means that, the voltage and current of the second DC meets the charging voltage and the charging current in terms of the normal charging mode respectively, for example meeting the charging requirements of the constant current or constant voltage adopted.

In an implementation of the present disclosure, by controlling the switch unit a chopping modulation can be directly performed on the voltage of the first pulsating waveform after a full-bridge rectification, i.e., the steamed-bun shaped waveform, and then the modulated voltage is sent to a high-frequency transformer and coupled from the primary side to the secondary side via the high-frequency transformer, and then is restored to the voltage/current of the steamed-bun shaped waveform after a synchronous rectification. The voltage/current with the steamed-bun shaped waveform is directly transmitted to the battery of the terminal to realize quick charging of the battery. The magnitude of the voltage of the steamed-bun shaped waveform may be adjusted according to the duty ratio of the PWM signal, such that the output of the power adapter meets the charging requirements of the battery. It can be seen, electrolytic capacitors at the primary side and the secondary side in the power adapter can be removed, and the battery can be directly charged with the voltage of the steamed-bun shaped waveform, such that the size of the power adapter may be reduced, thus realizing miniaturization of the power adapter, and greatly reducing the cost.

According to an implementation of the present disclosure, a frequency of the control signal is adjusted based on the voltage sampling value and/or the current sampling value. That is, the output of the PWM signal to the switch unit is controlled to maintain for a continuous period of time, and then stop for a predetermined time period and then restart. In this way, the voltages applied to the battery are intermittent, thus realizing intermittent charging of the battery, which avoids a safety hazard caused by the heating occurring when the battery is charged continuously and improves the reliability and safety of the charging of the battery. The control signal output to the switch unit is illustrated in FIG. 5.

Further, the above charging method further includes: performing a communication with the terminal via the first charging interface to obtain status information of the terminal, and adjusting the duty ratio of the control signal based on the status information of the terminal, the voltage sampling value and/or current sampling value.

In other words, when the second charging interface is coupled to the first charging interface, the power adapter and the terminal may send communication query instructions to each other, and a communication connection can be established between the power adapter and the terminal after a corresponding reply instruction is received, such that the power adapter can obtain the status information of the terminal, negotiate with the terminal about the charging mode and charging parameters (such as the charging current, the charging voltage) and control the charging process.

According to an implementation of the present disclosure, a voltage of a fourth pulsating waveform can be generated through a conversion by the transformer, and the voltage of the fourth pulsating waveform can be detected to generate a voltage detection value, so as to adjust the duty ratio of the control signal based on the voltage detection value.

In detail, the transformer can be provided with an auxiliary winding. The auxiliary winding can generate the voltage of the fourth pulsating waveform based on the voltage of the modulated first pulsating waveform. The output voltage of the power adapter can be reflected by detecting the voltage of the fourth pulsating waveform, and the duty ratio of the control signal can be adjusted based on the voltage detection value, such that the output of the power adapter meets the charging requirements of the battery.

In an implementation of the present disclosure, sampling the voltage after the second rectification to obtain the voltage sampling value includes: sampling and holding a peak value of the voltage after the second rectification, and sampling a zero-crossing point of the voltage after the second rectification; bleeding down at the zero-crossing point the voltage of a peak voltage sample-and-hold unit configured for sampling and holding the peak voltage; sampling the peak voltage in the peak voltage sample-and-hold unit so as to obtain the voltage sampling value. In this way, accurate sampling on the voltage output from the power adapter can be achieved, and it can be guaranteed that the voltage sampling value keeps synchronous with the voltage of the first pulsating waveform, i.e., the phase and the variation trend of magnitude of the voltage sampling value are consistent with those of the voltage of the first pulsating waveform respectively.

Further, in an implementation of the present disclosure, the above charging method includes: sampling the voltage of the first pulsating waveform, and controlling the switch unit to switch on for a predetermined time period to discharge the surge voltage in the first pulsating waveform when a sampled voltage value is greater than a first predetermined voltage value.

The voltage of the first pulsating waveform is sampled, and then the magnitude of the sampled voltage value is judged. When the sampled voltage value is greater than the first predetermined voltage value, it indicates that the power adapter is suffering from a lightning interference and a surge voltage occurs, and at this point, it needs to bleed down the surge voltage to ensure the safety and reliability of charging. It is required to control the switch unit to switch on for a certain time period to form a bleeder path (in other words, bleeder circuit), such that the surge voltage caused by the lightning can be bled down, thus avoiding lightning interference on the power adapter when charging the terminal, and effectively improving the safety and reliability of the charging of the terminal. The first predetermined voltage value may be determined according to actual needs.

According an implementation of the present disclosure, a communication with the terminal is performed via the first charging interface to determine a charging mode. When it is determined that the charging mode is the quick charging mode, the charging current and/or charging voltage corresponding to the quick charging mode can be obtained according to the status information of the terminal, so as to adjust the duty ratio of the control signal based on the charging current and/or charging voltage corresponding to the quick charging mode. The charging mode includes the quick charging mode and the normal charging mode.

In other words, when it is determined that the current charging mode is the quick charging mode, the charging current and/or charging voltage corresponding to the quick charging mode can be obtained according to the obtained status information of the terminal, such as the voltage, power, temperature of the battery, running parameters of the terminal and power consumption information of applications running on the terminal or the like. The duty ratio of the control signal is adjusted according to the obtained charging current and/or charging voltage, such that the output of the power adapter meets the charging requirements, thus realizing the quick charging of the battery.

The status information of the terminal includes the temperature of the battery. When the temperature of the battery is greater than a first predetermined temperature threshold, or the temperature of the battery is less than a second predetermined temperature threshold, the quick charging mode is switched to the normal charging mode if the current charging mode is the quick charging mode. The first predetermined temperature threshold is greater than the second predetermined temperature threshold. In other words, when the temperature of the battery is too low (for example, lower than a temperature corresponding to the second predetermined temperature threshold) or too high (for example, higher than a temperature corresponding to the first predetermined temperature threshold), it would be unsuitable for quick charging; therefore, it needs to switch from the quick charging mode to the normal charging mode. In implementations of the present disclosure, the first predetermined temperature threshold and the second predetermined temperature threshold can be set according to actual needs.

In an implementation of the present disclosure, the switch unit is controlled to switch off when the temperature of the battery is higher than a predetermined high-temperature protection threshold. Namely, when the temperature of the battery exceeds the high-temperature protection threshold, a high-temperature protection strategy will be required to control the switch unit to switch off, such that the power adapter stops charging the battery, thus realizing high-temperature protection of the battery and improving the charging safety. The high-temperature protection threshold may be different from or the same as the first temperature threshold. In an implementation, the high-temperature protection threshold is greater than the first temperature threshold.

In another implementation of the present disclosure, the terminal further obtains the temperature of the battery, and controls to stop charging the battery (for example by controlling a charging control switch to switch off at the terminal side) when the temperature of the battery is greater than the predetermined high-temperature protection threshold, so as to stop the charging process of the battery and to ensure the charging safety.

Moreover, in an implementation of the present disclosure, the charging method further includes: obtaining a temperature of the first charging interface, and controlling the switch unit to switch off when the temperature of the first charging interface is higher than a predetermined protection temperature. In other words, when the temperature of the charging interface exceeds a certain temperature, the control unit needs to apply the high-temperature protection strategy to control the switch unit to switch off, such that the power adapter stops charging the battery, thus realizing the high-temperature protection of the charging interface and improving the charging safety.

Certainly, in another implementation of the present disclosure, the terminal obtains the temperature of the first charging interface by performing two-way communication with the power adapter via the second charging interface. When the temperature of the first charging interface is higher than the predetermined protection temperature, the terminal controls to stop charging the battery, i.e., the charging control switch can be switched off at the terminal side, so as to stop the charging process of the battery, ensuring the charging safety.

During a process that the power adapter charges the terminal, the switch unit is controlled to switch off when the voltage sampling value is greater than a second predetermined voltage value. Namely, a determination is made regarding the magnitude of the voltage sampling value during the process that the power adapter charges the terminal. When the voltage sampling value is greater than the second predetermined voltage value, it indicates that the voltage output from the power adapter is too high. At this time, the power adapter is controlled to stop charging the terminal by controlling the switch unit to switch off. In other words, the over-voltage protection of the power adapter is realized by controlling the switch unit to switch off, thus ensuring the charging safety.

Certainly, in an implementation of the present disclosure, the terminal obtains the voltage sampling value by performing two-way communication with the power adapter via the second charging interface, and controls to stop charging the battery when the voltage sampling value is greater than the second predetermined voltage value. Namely, the charging control switch is controlled to switch off at the terminal side, so as to stop the charging process, such that the safety of charging can be ensured.

In an implementation of the present disclosure, during the process that the power adapter charges the terminal, the switch unit is controlled to switch off when the current sampling value is greater than a predetermined current value. In other words, during the process that the power adapter charges the terminal, a determination is made regarding the magnitude of the current sampling value. When the current sampling value is greater than the predetermined current value, it indicates that the current output from the power adapter is too high. At this point, the power adapter is controlled to stop charging the terminal by controlling the switch unit to switch off. In other words, the over-current protection of the power adapter is realized by controlling the switch unit to switch off, thus ensuring the charging safety.

Similarly, the terminal obtains the current sampling value by performing the two-way communication with the power adapter via the second charging interface, and controls to stop charging the battery when the current sampling value is greater than the predetermined current value. In other words, the charging control switch is controlled to be switched off at the terminal side, such that the charging process of the battery is stopped, thus ensuring the safety of charging.

The second predetermined voltage value and the predetermined current value may be set according to actual needs.

In implementations of the present disclosure, the status information of the terminal includes the power of the battery, the temperature of the battery, the voltage/current of the terminal, interface information of the terminal and path impedance information of the terminal, and the like.

In detail, the power adapter can be coupled to the terminal via a universal serial bus (USB) interface. The USB interface may be a general USB interface, or a micro USB interface. A data wire in the USB interface is configured as the data wire in the first charging interface, and configured for the two-way communication between the power adapter and the terminal. The data wire may be a D+ and/or D− line in the USB interface. The two-way communication may refer to an information interaction performed between the power adapter and the terminal.

The power adapter performs the two-way communication with the terminal via the data wire in the USB interface, so as to determine to charge the terminal with the quick charging mode.

In an implementation, when the power adapter performs the two-way communication with the terminal via the first charging interface so as to determine to charge the terminal with the quick charging mode, the power adapter sends a first instruction to the terminal that is configured to query the terminal whether to enable the quick charging mode. The power adapter receives a reply instruction responsive to the first instruction from the terminal. The reply instruction responsive to the first instruction is configured to indicate that the terminal agrees to enable the quick charging mode.

In an implementation, before the power adapter sends the first instruction to the terminal, the power adapter charges the terminal in the normal charging mode. When the power adapter determines that a charging duration of the normal charging mode is greater than a predetermined threshold, the power adapter sends the first instruction to the terminal.

It should be noted that, after the power adapter determines that a charging duration of the normal charging mode is greater than the predetermined threshold, the power adapter may determine that the terminal has identified it as a power adapter, such that the quick charging query communication may be enabled.

In an implementation, the power adapter is controlled to adjust a charging current to one corresponding to the quick charging mode by controlling the switch unit. Before the power adapter charges the terminal with the charging current corresponding to the quick charging mode, two-way communication is performed with the terminal via the first charging interface to determine a charging voltage corresponding to the quick charging mode, and the power adapter is controlled to adjust a charging voltage to one corresponding to the quick charging mode.

In an implementation, performing two-way communication with the terminal via the first charging interface to determine the charging voltage corresponding to the quick charging mode includes: sending by the power adapter a second instruction to the terminal, receiving by the power adapter a reply instruction responsive to the second instruction sent from the terminal, and determining by the power adapter the charging voltage corresponding to the quick charging mode according to the reply instruction responsive to the second instruction. The second instruction is configured to query whether a current output voltage of the power adapter is suitable for being used as the charging voltage corresponding to the quick charging mode. The reply instruction responsive to the second instruction is configured to indicate that the current output voltage of the power adapter is suitable, high, or low.

In an implementation, before controlling the power adapter to adjust the charging current to one corresponding to the quick charging mode, the charging current corresponding to the quick charging mode is determined by performing two-way communication with the terminal via the first charging interface.

In an implementation, determining the charging current corresponding to the quick charging mode by performing the two-way communication with the terminal via the first charging interface includes: sending by the power adapter a third instruction to the terminal, receiving by the power adapter a reply instruction responsive to the third instruction sent from the terminal and determining by the power adapter the charging current corresponding to the quick charging mode according to the reply instruction responsive to the third instruction. The third instruction is configured to query a maximum charging current currently supported by the terminal. The reply instruction responsive to the third instruction is configured to indicate the maximum charging current currently supported by the terminal.

The power adapter may determine the above maximum charging current as the charging current corresponding to the quick charging mode, or may set the charging current as one smaller than the maximum charging current.

In an implementation, during the process that the power adapter charges the terminal with the quick charging mode, the two-way communication is performed with the terminal via the first charging interface, so as to continuously adjust a charging current output to the battery from the power adapter by controlling the switch unit.

The power adapter may continuously query the status information of the terminal, e.g., the battery voltage of the terminal, the power of the battery, etc., so as to adjust the charging current continuously.

In an implementation, performing the two-way communication with the terminal via the first charging interface to continuously adjust the charging current output to the battery from the power adapter by controlling the switch unit includes: sending by the power adapter a fourth instruction to the terminal, receiving by the power adapter a reply instruction responsive to the fourth instruction sent by the terminal, and adjusting the charging current by controlling the switch unit based on the current voltage of the battery. The fourth instruction is configured to query a current voltage of the battery in the terminal. The reply instruction responsive to the fourth instruction is configured to indicate the current voltage of the battery within the terminal.

In an implementation, adjusting the charging current by controlling the switch unit according to the current voltage of the battery includes: adjusting the charging current output to the battery from the power adapter to one corresponding to the current voltage of the battery by controlling the switch unit based on the current voltage of the battery and predetermined correspondence between battery voltage values and charging current values.

In detail, the power adapter may store in advance the correspondence between battery voltage values and charging current values.

In an implementation, during the process that the power adapter charges the terminal with the quick charging mode, it is determined whether the first charging interface and the second charging interface are in a poor contact by performing the two-way communication with the terminal via the first charging interface. When it is determined that the first charging interface and the second charging interface are in a poor contact, the power adapter is controlled to quit the quick charging mode.

In an implementation, before determining whether the first charging interface and the second charging interface are in a poor contact, the power adapter receives information indicating path impedance of the terminal from the terminal. The power adapter sends a fourth instruction to the terminal. The fourth instruction is configured to query a voltage of the battery of the terminal. The power adapter receives a reply instruction responsive to the fourth instruction sent by the terminal. The reply instruction responsive to the fourth instruction is configured to indicate the voltage of the battery of the terminal. The power adapter determines path impedance from the power adapter to the battery according to an output voltage of the power adapter and the voltage of the battery and determines whether the first charging interface and the second charging interface are in a poor contact according to the path impedance from the power adapter to the battery, the path impedance of the terminal, and path impedance of a charging circuit between the power adapter and the terminal.

In an implementation, before the power adapter is controlled to quit the quick charging mode, a fifth instruction is sent to the terminal. The fifth instruction is configured to indicate that the first charging interface and the second charging interface are in a poor contact.

After sending the fifth instruction, the power adapter may quit the quick charging mode or reset.

The quick charging process according to implementations of the present disclosure is described from the perspective of the power adapter, and then the quick charging process according to implementations of the present disclosure will be described from the perspective of the terminal as follows.

In implementations of the present disclosure, the terminal is operable in the normal charging mode and the quick charging mode. The charging current of the quick charging mode is greater than that of the normal charging mode. The terminal performs the two-way communication with the power adapter via the second charging interface such that the power adapter determines to charge the terminal with the quick charging mode. The power adapter makes outputs based on a charging current corresponding to the quick charging mode for charging the battery of the terminal.

In an implementation, performing by the terminal the two-way communication with the power adapter via the second charging interface such that the power adapter determines to charge the terminal with the quick charging mode includes: receiving by the terminal the first instruction sent by the power adapter, in which the first instruction is configured to query the terminal whether to enable the quick charging mode; sending by the terminal a reply instruction responsive to the first instruction to the power adapter. The reply instruction responsive to the first instruction is configured to indicate that the terminal agrees to enable the quick charging mode.

In an implementation, before the terminal receives the first instruction sent by the power adapter, the terminal is charged by the power adapter in the normal charging mode. When the power adapter determines that a charging duration of the normal charging mode is greater than a predetermined threshold, the terminal receives the first instruction sent by the power adapter.

In an implementation, before the power adapter makes outputs based on the charging current corresponding to the quick charging mode for charging the battery in the terminal, the terminal performs the two-way communication with the power adapter via the second charging interface, such that the power adapter determines a charging voltage corresponding to the quick charging mode.

In an implementation, performing by the terminal the two-way communication with the power adapter via the second charging interface such that the power adapter determines the charging voltage corresponding to the quick charging mode includes: receiving by the terminal a second instruction sent by the power adapter, and sending by the terminal a reply instruction responsive to the second instruction to the power adapter. The second instruction is configured to query whether a current output voltage of the power adapter is suitable for being used as the charging voltage corresponding to the quick charging mode. The reply instruction responsive to the second instruction is configured to indicate that the current output voltage of the power adapter is suitable, high, or low.

In an implementation, before the terminal receives the charging current corresponding to the quick charging mode from the power adapter for charging the battery in the terminal, the terminal performs the two-way communication with the power adapter via the second charging interface, such that the power adapter determines the charging current corresponding to the quick charging mode.

Performing by the terminal the two-way communication with the power adapter via the second charging interface such that the power adapter determines the charging current corresponding to the quick charging mode includes: receiving by the terminal a third instruction sent by the power adapter, where the third instruction is configured to query a maximum charging current currently supported by the terminal; sending by the terminal a reply instruction responsive to the third instruction to the power adapter, where the reply instruction responsive to the third instruction is configured to indicate the maximum charging current currently supported by the terminal, such that the power adapter determines the charging current corresponding to the quick charging mode according to the maximum charging current.

In an implementation, during a process that the power adapter charges the terminal with the quick charging mode, the terminal performs the two-way communication with the power adapter via the second charging interface, such that the power adapter continuously adjusts the charging current output from the power adapter to the battery.

Performing by the terminal the two-way communication with the power adapter via the second charging interface such that the power adapter continuously adjusts the charging current output from the power adapter to the battery includes: receiving by the terminal a fourth instruction sent by the power adapter, where the fourth instruction is configured to query a current voltage of the battery in the terminal; sending by the terminal a reply instruction responsive to the fourth instruction to the power adapter, where the reply instruction responsive to the fourth instruction is configured to indicate the current voltage of the battery in the terminal, such that the power adapter continuously adjusts the charging current output from the power adapter to the battery based on the current voltage of the battery.

In an implementation, during the process that the power adapter charges the terminal with the quick charging mode, the terminal performs the two-way communication with the power adapter via the second charging interface, such that the power adapter determines whether the first charging interface and the second charging interface are in a poor contact.

Performing by the terminal the two-way communication with the power adapter via the second charging interface, such that the power adapter determines whether the first charging interface and the second charging interface are in a poor contact includes: receiving by the terminal a fourth instruction sent by the power adapter, in which the fourth instruction is configured to query a current voltage of the battery in the terminal; sending by the terminal a reply instruction responsive to the fourth instruction to the power adapter, where the reply instruction responsive to the fourth instruction is configured to indicate the current voltage of the battery in the terminal, such that the power adapter determines whether the first charging interface and the second charging interface are in a poor contact based on an output voltage of the power adapter and the current voltage of the battery.

In an implementation, the terminal receives a fifth instruction sent by the power adapter. The fifth instruction is configured to indicate that the first charging interface and the second charging interface are in a poor contact.

In order to enable the quick charging mode, the power adapter may perform a quick charging communication procedure with the terminal, for example, by one or more handshakes, so as to realize the quick charging of battery. Referring to FIG. 6, the quick charging communication procedure according to implementations of the present disclosure and respective stages in the quick charging process will be described in detail. It should be understood that, communication actions or operations illustrated in FIG. 6 are merely exemplary. Other operations or various modifications of respective operations in FIG. 6 can be implemented in implementations of the present disclosure. In addition, respective stages in FIG. 6 may be executed in orders different from that illustrated in FIG. 6, and it is not necessary to execute all the operations illustrated in FIG. 6.

In conclusion, with the charging method according to implementations of the present disclosure, the power adapter is controlled to output the voltage of the third pulsating waveform or the second DC which meets the charging requirements, and the voltage of the third pulsating waveform or the second DC output from the power adapter can be directly applied to the battery of the terminal, thus realizing quick charging of the battery by the pulsating output voltage/current or normal charging of the battery by the second DC, such that the charging method can be compliable with quick charging and normal charging. Compared with the constant voltage and constant current, the magnitude of the pulsating output voltage/current is periodically changed, such that lithium precipitation of the lithium battery may be reduced, the service life of the battery may be improved, the probability and intensity of arcing of a contact of a charging interface may be reduced, and the service life of the charging interfaces may be prolonged. Moreover, it is beneficial to reduce polarization effect of the battery, improve the charging speed, and reduce the heat emitted by the battery, thus ensuring the reliability and safety of the terminal during charging. Moreover, since the power adapter can output the voltage of the pulsating waveform, it may be not necessary to provide an electrolytic capacitor in the power adapter, which can not only realize simplification and miniaturization of the power adapter, but can also greatly reduce the cost.

In the specification of the present disclosure, it is to be understood that terms such as "central," "longitudinal," "lateral," "length," "width," "thickness," "upper," "lower," "front," "rear," "left," "right," "vertical," "horizontal," "top," "bottom," "inner," "outer," "clockwise," "counter-clockwise," "axial," "radial," and "circumference" refer to the orientations and locational relations illustrated in the drawings, and for describing the present disclosure and for describing in a simple manner, and which are not intended to indicate or imply that the device or the elements are disposed to locate at the specific directions or are structured and performed in the specific directions, which could not to be understood as limiting the present disclosure.

In addition, terms such as "first" and "second" are used herein for purposes of description and are not intended to indicate or imply relative importance or significance or to imply the number of indicated technical features. Thus, the feature defined with "first" and "second" may comprise one or more of such a feature. In the description of the present disclosure, "a plurality of" means two or more than two, unless specified otherwise.

In the present disclosure, unless specified or limited otherwise, terms "mounted," "connected," "coupled," "fixed", and the like are used in a broad sense, and may include, for example, fixed connections, detachable connections, or integral connections; may also be mechanical or electrical connections; may also be direct connections or indirect connections via intervening structures; may also be inner communications of two elements, as can be understood by those skilled in the art depending on specific contexts.

In the present disclosure, unless specified or limited otherwise, a structure in which a first feature is "on" or "below" a second feature may encompass an implementation in which the first feature is in a direct contact with the second feature, and may also encompass an implementation in which the first feature and the second feature are not in a direct contact, but are contacted via an additional feature provided therebetween. Furthermore, expressions such as "a first feature is "on," "above," or "on top of" a second feature" may encompass an implementation in which the first feature is right or obliquely "on," "above," or "on top of" the second feature, or just that the first feature is at a height higher than that of the second feature; while expressions such as "a first feature "below," "under," or "on bottom of" a second feature" may encompass an implementation in which the first feature is right or obliquely "below," "under," or "on bottom of" the second feature, or just that the first feature is at a height lower than that of the second feature.

References throughout this specification to "an implementation," "some implementations," "one implementation", "another example," "an example," "a specific example," or "some examples," mean that a particular feature, structure, material, or characteristic described in connection with the implementation or example is included in at least one implementation or example of the present disclosure. Thus, the appearances of the phrases such as "in some implementations," "in one implementation", "in an implementation," "in another example," "in an example," "in a specific example," or "in some examples," in various places throughout the specification are not necessarily referring to the same implementation or example of the present disclosure. Furthermore, the particular features, structures, materials, or characteristics may be combined in any suitable manner in one or more implementations or examples.

Those skilled in the art may be aware that, in combination with the examples described in the implementations disclosed in the specification, units and algorithmic steps can be implemented by electronic hardware, or a combination of computer software and electronic hardware. In order to clearly illustrate interchangeability of hardware and software, components and steps of each example are already described in the description according to the function commonalities. Whether the functions are executed by hardware or software depends on particular applications and design constraints of the technical solutions. Persons skilled in the art may use different methods to implement the described functions for each particular application, but it should not be considered that the implementation goes beyond the scope of the present disclosure.

Those skilled in the art may be aware that, with respect to the working process of the system, the device and the unit, reference is made to the part of description of the method implementation for simplicity and convenience, which are described herein.

In implementations of the present disclosure, it should be understood that, the disclosed system, device, and method may be implemented in other way. For example, implementations of the described device are merely exemplary. The partition of units is merely a logical function partitioning. There may be other partitioning ways in practice. For example, several units or components may be integrated into another system, or some features may be ignored or not implemented. Further, the coupling between each other or directly coupling or communication connection may be implemented via some interfaces. The indirect coupling or communication connection may be implemented in an electrical, mechanical or other manner.

In implementations of the present disclosure, it should be understood that, the units illustrated as separate components can be or not be separated physically, and components described as units can or cannot be physical units, i.e., can be located at one place, or can be distributed onto multiple network units. It is possible to select some or all of the units according to actual needs to achieve objects of the present disclosure.

In addition, each functional unit in the present disclosure may be integrated in one progressing module, or each functional unit exists as an independent unit, or two or more functional units may be integrated in one module.

If the integrated module is embodied in software and sold or used as an independent product, it can be stored in the computer readable storage medium. Based on this, the technical solution of the present disclosure or a part making a contribution to the related art or a part of the technical solution may be embodied in the form of software product. The computer software product is stored in a storage medium, including some instructions for causing one computer device (such as a personal PC, a server, or a network device etc.) to execute all or some of steps of the method according to implementations of the present disclosure. The above-mentioned storage medium may be a medium able to store program codes, such as, USB flash disk, mobile hard disk drive (mobile HDD), read-only memory (ROM), random-access memory (RAM), a magnetic tape, a floppy disc, an optical data storage device, and the like.

Although explanatory implementations have been illustrated and described, it would be appreciated by those skilled in the art that the above implementations cannot be construed to limit the present disclosure, and changes, substitutes, and modifications can be made to the implementations without departing from the spirit, principles, and scope of the present disclosure.

What is claimed is:

1. A system for charging, comprising:
    a first rectification unit, configured to rectify an input alternating current (AC) voltage and output a voltage of a first pulsating waveform;
    a switch unit, configured to modulate the voltage of the first pulsating waveform according to a control signal;
    a transformer, configured to output a voltage of a second pulsating waveform based on the voltage of the modulated first pulsating waveform;
    a second rectification unit, configured to rectify the voltage of the second pulsating wave form and output a voltage of a third pulsating waveform;
    a filter unit, configured to filter the voltage of the third pulsating waveform and output a second direct current (DC) voltage;
    a controllable switch, configured to control whether the filter unit operates;
    a first charging interface;
    a sampling unit, configured to sample at least one of an output voltage or an output current of the second rectification unit to obtain at least one of a voltage sampling value or a current sampling value;
    a control unit, coupled with the sampling unit, the switch unit, and the controllable switch, respectively, the control unit being configured to control the controllable switch to cause the filter unit to operate to
        output the second DC voltage via the first charging interface;
        control the controllable switch to cause the filter unit to stop operating to output the voltage of the third pulsating waveform via the first charging interface; and
        output the control signal to the switch unit to adjust at least one of a duty ratio of the control signal based on the voltage sampling value or the current sampling value, wherein the voltage of the third pulsating waveform or the second DC voltage meets charging requirements; and
    a second charging interface and a battery coupled with the second charging interface, wherein the second charging interface is configured to apply the voltage of the third pulsating waveform or the second DC voltage to the battery when the second charging interface is coupled to the first charging interface.

2. The system of claim 1, wherein the control unit is configured to communicate via the first charging interface to determine a charging mode, the charging mode comprising a quick charging mode and a normal charging mode.

3. The system of claim 2, further comprising a charging control switch and a controller, wherein the charging control switch is coupled between the second charging interface and the battery, and configured to control switching of a charging process of the battery under the control of the controller.

4. The system of claim 3, wherein the battery is capable of being charged with the normal charging mode and the quick charging mode, wherein a charging current of the quick charging mode is greater than the charging current of the normal charging mode, the controller is configured to conduct two-way communication with the control unit, such that the system determines to charge a terminal with the quick charging mode, wherein the control unit controls the system to make outputs according to the charging current corresponding to the quick charging mode to charge the battery.

5. A power adapter, comprising:
    a first rectification unit, configured to rectify an input alternating current (AC) voltage and output a voltage of a first pulsating waveform;
    a switch unit, configured to modulate the voltage of the first pulsating waveform according to a control signal;
    a transformer, configured to output a voltage of a second pulsating waveform based on the voltage of the modulated first pulsating waveform;
    a second rectification unit, configured to rectify the voltage of the second pulsating wave form and output a voltage of a third pulsating waveform;
    a filter unit, configured to filter the voltage of the third pulsating waveform and output a second direct current (DC) voltage;
    a controllable switch, configured to control whether the filter unit operates;
    a first charging interface, configured to apply the voltage of the third pulsating waveform or the second DC voltage to a battery of a terminal via a second charging interface of the terminal when the first charging interface is coupled with the second charging interface, wherein the second charging interface is coupled with the battery;
    a sampling unit, configured to sample at least one of an output voltage or an output current of the second rectification unit to obtain at least one of a voltage sampling value or a current sampling value; and
    a control unit, coupled with the sampling unit, the switch unit, and the controllable switch, respectively; the control unit being configured to
        control the controllable switch to cause the filter unit to operate to output the second DC voltage via the first charging interface;
        control the controllable switch to cause the filter unit to stop operating to output the voltage of the third pulsating waveform via the first charging interface; and
        output the control signal to the switch unit to adjust at least one of a duty ratio of the control signal based on the voltage sampling value or the current sampling value, wherein the voltage of the third pulsating waveform or the second DC voltage meets charging requirements.

6. The power adapter of claim 5, wherein the control unit is further configured to adjust a frequency of the control signal based on at least one of the voltage sampling value or the current sampling value.

7. The power adapter of claim 5, wherein the control unit is coupled to the first charging interface and configured to communicate with the terminal via the first charging interface to acquire status information of the terminal.

8. The power adapter of claim 7, wherein the control unit is further configured to adjust at least one of the duty ratio of the control signal based on the status information of the terminal, the voltage sampling value, or the current sampling value.

9. The power adapter of claim 5, further comprising:
a driving unit, coupled between the switch unit and the control unit and configured to drive the switch unit to switch on or off according to the control signal.

10. The power adapter of claim 5, wherein the sampling unit comprises:
a first current sampling circuit, configured to sample a current output from the second rectification unit to obtain the current sampling value; and
a first voltage sampling circuit, configured to sample a voltage output from the second rectification unit to obtain the voltage sampling value.

11. The power adapter of claim 10, wherein the first voltage sampling circuit comprises:
a peak voltage sample-and-hold unit, configured to sample and hold a peak voltage of the voltage of the third pulsating waveform;
a zero-crossing point sampling unit, configured to sample a zero-crossing point of the voltage of the third pulsating waveform;
a bleeder unit, configured to bleed down the voltage of the peak voltage sample-and-hold unit at the zero-crossing point; and
an analog-digital (AD) sampling unit, configured to sample the peak voltage of the peak voltage sample-and-hold unit to obtain the voltage sampling value.

12. The power adapter of claim 5, wherein the modulated first pulsating waveform is synchronized with the third pulsating waveform.

13. The power adapter of claim 5, further comprising:
a second voltage sampling circuit, coupled with the control unit and configured to sample the voltage of the first pulsating waveform; and
the control unit being further configured to control the switch unit to switch on for a first preset time period for discharging, when a voltage value sampled by the second voltage sampling circuit is greater than a first preset voltage value.

14. The power adapter of claim 5, wherein the control unit is configured to communicate with the terminal via the first charging interface to determine a charging mode, the charging mode comprising a quick charging mode and a normal charging mode.

15. The power adapter of claim 14, wherein the controllable switch and the filter unit are coupled in series, and further coupled with a first output end of the second rectification unit, the control unit being further configured to control the controllable switch to switch on when determining the charging mode as the normal charging mode and control the controllable switch to switch off when determining the charging mode as the quick charging mode.

16. The power adapter of claim 14, wherein the control unit is further configured to obtain at least one of a charging current or a charging voltage corresponding to the quick charging mode based on status information of the terminal when the control unit determines the charging mode as the quick charging mode, and adjust the duty ratio of the control signal based on at least one of the charging current or the charging voltage corresponding to the quick charging mode.

17. The power adapter of claim 16, wherein the status information of the terminal comprises a temperature of the battery, wherein when the temperature of the battery is greater than a first preset temperature threshold or lower than a second preset temperature threshold, and a current charging mode is the quick charging mode, the control unit is configured to switch the quick charging mode to the normal charging mode, wherein the first preset temperature threshold is greater than the second preset temperature threshold.

18. The power adapter of claim 14, wherein when the control unit performs two-way communication with the terminal via the first charging interface and determines to charge the terminal with the quick charging mode, the control unit is further configured to transmit a first instruction to the terminal and receive, from the terminal, a reply instruction in response to the first instruction, wherein the first instruction is configured to inquire the terminal whether to enable the quick charging mode, and the reply instruction in response to the first instruction is configured to indicate that the terminal agrees to enable the quick charging mode.

19. The power adapter of claim 18, wherein prior to the control unit transmits the first instruction to the terminal, the power adapter is configured to charge the terminal with the normal charging mode, and the control unit is configured to transmit the first instruction to the terminal after the control unit determines that a charging duration of the normal charging mode is greater than a preset threshold.

20. The power adapter of claim 18, wherein the control unit is further configured to control the power adapter to adjust a charging current to the charging current corresponding to the quick charging mode by controlling the switch unit, and prior to the power adapter charges the terminal with the charging current corresponding to the quick charging mode, the control unit is further configured to conduct the two-way communication with the terminal via the first charging interface to determine a charging voltage corresponding to the quick charging mode and control the power adapter to adjust a charging voltage to the charging voltage corresponding to the quick charging mode.

21. The power adapter of claim 20, wherein the control unit is further configured to conduct the two-way communication with the terminal via the first charging interface to determine the charging current corresponding to the quick charging mode, prior to controlling the power adapter to adjust the charging current to the charging current corresponding to the quick charging mode.

22. A charging method, comprising:
performing a first rectification on an input alternating current(AC) voltage and outputting a voltage of a first pulsating waveform, when a first charging interface of a power adapter is coupled with a second charging interface of a terminal;
controlling a switch unit to modulate the voltage of the first pulsating waveform, converting the voltage of the first pulsating waveform through a transformer, and outputting a voltage of a second pulsating waveform;
performing a second rectification on the voltage of the second pulsating waveform and outputting a voltage of a third pulsating waveform;
filtering the voltage of the third pulsating waveform and outputting a second direct current (DC) voltage and applying the second DC voltage to a battery of the terminal via the second charging interface when the power adapter charges the terminal with a normal charging mode;

applying the voltage of the third pulsating waveform to the battery of the terminal directly via the second charging interface when the power adapter charges the terminal with a quick charging mode;

sampling at least one of a voltage or current after the second rectification to obtain at least one of a voltage sampling value or a current sampling value; and adjusting a duty ratio of a control signal of the switch unit based on at least one of the voltage sampling value or the current sampling value, wherein the voltage of the third pulsating waveform or the second DC voltage meets charging requirements.

23. The method of claim 22, further comprising:

adjusting a frequency of the control signal based on at least one of the voltage sampling value or the current sampling value.

24. The method of claim 22, further comprising:

converting through the transformer to generate a voltage of a fourth pulsating waveform and detecting the voltage of the fourth pulsating waveform to generate a voltage detection value to adjust the duty ratio of the control signal based on the voltage detection value.

25. The method of claim 22, wherein sampling the voltage after the second rectification to obtain the voltage sampling value comprises:

sampling and holding a peak voltage of the voltage after the second rectification, and sampling a zero-crossing point of the voltage after the second rectification;

bleeding down, at the zero-crossing point, the voltage of a peak voltage sample-and-hold unit that is configured to sample and hold the peak voltage; and sampling the peak voltage of the peak voltage sample-and-hold unit to obtain the voltage sampling value.

* * * * *